(12) United States Patent
Yuan et al.

(10) Patent No.: US 11,177,327 B2
(45) Date of Patent: Nov. 16, 2021

(54) DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Guangcai Yuan, Beijing (CN); Haixu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 79 days.

(21) Appl. No.: 16/643,082

(22) PCT Filed: Jul. 24, 2019

(86) PCT No.: PCT/CN2019/097529
§ 371 (c)(1),
(2) Date: Feb. 28, 2020

(87) PCT Pub. No.: WO2020/024858
PCT Pub. Date: Feb. 6, 2020

(65) Prior Publication Data
US 2020/0350374 A1 Nov. 5, 2020

(30) Foreign Application Priority Data
Aug. 1, 2018 (CN) .......................... 201810865983.3

(51) Int. Cl.
*H01L 27/32* (2006.01)
*H01L 31/075* (2012.01)
*H01L 51/56* (2006.01)

(52) U.S. Cl.
CPC ...... *H01L 27/3227* (2013.01); *H01L 27/3246* (2013.01); *H01L 31/075* (2013.01); *H01L 51/56* (2013.01)

(58) Field of Classification Search
None
See application file for complete search history.

(56) References Cited

U.S. PATENT DOCUMENTS 9,305,989 B2 * 4/2016 In .......................... H01L 27/3269
9,601,084 B2 3/2017 Li et al.
(Continued)

FOREIGN PATENT DOCUMENTS

CN 101908529 A 12/2010
CN 103810981 A 5/2014
(Continued)

OTHER PUBLICATIONS

First Chinese Office Action from corresponding Chinese Patent Application No. 201810865983.3 dated Apr. 13, 2020.

*Primary Examiner* — J. E. Schoenholtz
(74) *Attorney, Agent, or Firm* — Dilworth & Barrese, LLP.; Michael J. Musella, Esq.

(57) ABSTRACT

A display panel and manufacturing method thereof, a display device. The display panel includes a base substrate, light-emitting element and a photoelectric conversion structure: the light-emitting element is disposed on the base substrate; the photoelectric conversion structure is disposed on the base substrate and configured to receive a part of light emitted by the light-emitting element, convert energy of light received by the photoelectric conversion structure into electric energy, and supply the electric energy to the light-emitting element.

20 Claims, 15 Drawing Sheets

(56) References Cited

U.S. PATENT DOCUMENTS

| | | | |
|---|---|---|---|
| 10,916,598 B2* | 2/2021 | Li | .................... H01L 51/5218 |
| 2009/0257105 A1 | 10/2009 | Xu et al. | |
| 2015/0249119 A1* | 9/2015 | In | .................... H01L 27/3269 |
| | | | 257/40 |
| 2019/0036047 A1 | 1/2019 | Zhou | |
| 2019/0164493 A1 | 5/2019 | Liu et al. | |

FOREIGN PATENT DOCUMENTS

| | | |
|---|---|---|
| CN | 107425042 A | 12/2017 |
| CN | 107863065 A | 3/2018 |
| CN | 109037293 A | 12/2018 |

* cited by examiner

DISPLAY PANEL, MANUFACTURING METHOD THEREOF, AND DISPLAY DEVICE

The present application claims priority to Chinese patent application No. 201810865983.3, filed on Aug. 1, 2018, the entire disclosure of which is incorporated herein by reference as part of the present application.

TECHNICAL FIELD

At least one embodiment of the present disclosure relates to a display panel and a manufacturing method, and a display device.

BACKGROUND

The organic light-emitting diode (OLED) has illustrated great potential in high-tech display fields such as flexible display and transparent display. At the same time, it also has good development in the field of lighting.

The OLED display device is also involved in an issue of power endurance while meeting the needs of users, which is of great significance to both manufacturers and consumers.

Taking a mobile phone as an example, current methods for improving the endurance capability of the mobile phone are basically focused on increasing the battery capacity and reducing the power consumption of electrical devices in the mobile phone. Increasing the battery capacity means using a high-capacity battery, however the high-capacity battery has a certain potential safety hazard. In addition, with the continuous maturity of manufacturing technology of the mobile phone, and in order to meet various needs of users, it becomes more and more difficult to reduce the power consumption of the electrical devices in the mobile phone.

SUMMARY

At least one embodiment of the present disclosure provides a display panel, which includes a base substrate, a light-emitting element and a photoelectric conversion structure; the light-emitting element is disposed on the base substrate; the photoelectric conversion structure is disposed on the base substrate, and configured to receive a part of light emitted by the light-emitting element, convert energy of light received by the photoelectric conversion structure into electric energy, and supply the electric energy to the light-emitting element.

For example, in the display panel provided by an embodiment of the present disclosure, the photoelectric conversion structure includes: a first electrode, a second electrode and a photoelectric conversion layer. The first electrode is disposed on the base substrate; the second electrode is disposed on one side of the first electrode away from the base substrate; the photoelectric conversion layer is disposed between the first electrode and the second electrode, and configured to convert energy of light received by the photoelectric conversion layer into electric energy.

For example, in the display panel provided by an embodiment of the present disclosure, the photoelectric conversion layer is a PIN junction, and the PIN junction includes: a P-type semiconductor layer, an N-type semiconductor layer and an intrinsic semiconductor layer. The N-type semiconductor layer is stacked with the P-type semiconductor layer; the intrinsic semiconductor layer is between the N-type semiconductor layer and the P-type semiconductor layer.

For example, in the display panel provided by an embodiment of the present disclosure, a material of the P-type semiconductor layer, a material of the N-type semiconductor layer, and a material of the intrinsic semiconductor layer are all amorphous silicon.

For example, in the display panel provided by an embodiment of the present disclosure, the first electrode is an opaque reflective electrode, and the second electrode is a transparent electrode or an opaque reflective electrode.

For example, the display panel provided by an embodiment of the present disclosure further includes a power supply, and the light-emitting element includes an anode, a light-emitting layer and a cathode which are sequentially away from the base substrate; the first electrode of the photoelectric conversion structure and the second electrode of the photoelectric conversion structure are electrically connected with an input terminal of the power supply; the anode of the light-emitting element and the cathode of the light-emitting element are electrically connected with an output terminal of the power supply.

For example, the display panel provided by an embodiment of the present disclosure further includes: a plurality of pixel units arranged in an array and a pixel definition layer; each pixel unit of the plurality of pixel units includes the light-emitting element; the pixel definition layer which is light-transmitting is located between adjacent pixel units in the plurality of pixel units to define the plurality of pixel units; an orthographic projection of the photoelectric conversion structure on the base substrate is located within an orthographic projection of the pixel definition layer on the base substrate.

For example, in the display panel provided by an embodiment of the present disclosure, the photoelectric conversion structure is on a side of the pixel definition layer close to the base substrate and is on a side of the light-emitting element close to the base substrate.

For example, the display panel provided by an embodiment of the present disclosure further includes a driving circuit layer configured to drive the plurality of pixel units, the driving circuit layer includes a thin film transistor, and the first electrode of the photoelectric conversion structure is in a same layer as a drain electrode of the thin film transistor and a source electrode of the thin film transistor.

For example, in the display panel provided by an embodiment of the present disclosure, the light-emitting element is a top light-emitting element, and at least part of an orthographic projection of the thin film transistor on the base substrate overlaps with an orthographic projection of the light-emitting element on the base substrate.

For example, in the display panel provided by an embodiment of the present disclosure, a distance between a lower surface of the photoelectric conversion structure facing the base substrate and the base substrate, a distance between a surface of the light-emitting element facing the base substrate and the base substrate, and a distance between a surface of the pixel definition layer facing the base substrate and the base substrate, are equal to each other.

For example, in the display panel provided by an embodiment of the present disclosure, the light-emitting element includes an anode, a light-emitting layer and a cathode which are disposed sequentially away from the base substrate; and the first electrode is in a same layer as the anode of the light-emitting element.

For example, in the display panel provided by an embodiment of the present disclosure, the photoelectric conversion structure is inside the pixel definition layer, and the pixel definition layer covers an upper surface of the photoelectric conversion structure facing away from the base substrate and a side surface of the photoelectric conversion structure intersected with the upper surface of the photoelectric conversion structure.

For example, in the display panel provided by an embodiment of the present disclosure, the pixel definition layer includes a groove, the groove includes a bottom surface parallel to the base substrate and a side surface intersected with the bottom surface; the orthographic projection of the photoelectric conversion structure on the base substrate within an orthographic projection of a whole constituted by the bottom surface of the groove and the side surface of the groove on the base substrate; the groove is configured to allow a part of light emitted by the light-emitting element to be reflected by the side surface of the groove and then to be incident to the photoelectric conversion structure.

For example, in the display panel provided by an embodiment of the present disclosure, an included angle between the side surface and the bottom surface of the groove is an obtuse angle.

For example, in the display panel provided by an embodiment of the present disclosure, a range of the included angle between the side surface and the bottom surface of the groove is 110°~170°; an orthographic projection of the side surface of the groove on the base substrate overlaps with a part of the orthographic projection of the photoelectric conversion structure on the base substrate, and a width of the overlapped part along a direction parallel to the base substrate is ⅓ of a width of the orthographic projection of the photoelectric conversion structure on the base substrate along the direction parallel to the base substrate; in a direction perpendicular to the base substrate, the rest portion of the pixel definition layer other than the groove has a first surface away from the base substrate and a second surface close to the base substrate, and a distance between the bottom surface of the groove and the first surface of the pixel definition layer is larger than ⅔ of a distance between the second surface of the pixel definition layer and the first surface of the pixel definition layer.

For example, the display panel provided by an embodiment of the present disclosure further includes: a reflective structure disposed on at least a part of the side surface of the groove.

For example, in the display panel provided by an embodiment of the present disclosure, the side surface of the groove is a curved surface recessed toward a direction away from the bottom surface of the groove, and an included angle between a tangent line of the curved surface and the bottom surface of the groove is an obtuse angle.

At least one embodiment of the present disclosure further provides a display device, which includes any one display panel provided by the embodiments of the present disclosure.

At least one embodiment of the present disclosure further provides a manufacturing method of a display panel, which includes: providing a base substrate; forming a light-emitting element and a photoelectric conversion structure on the base substrate, in which the photoelectric conversion structure is configured to receive a part of light emitted by the light-emitting element, convert energy of light received by the photoelectric conversion structure into electric energy, and supply the electric energy to the light-emitting element.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

The dimensions of the accompanying drawings used in the present disclosure are not strictly drawn to actual scale, a total count of photoelectric conversion structures and a total count of pixel units in the display panel is not limited to the number illustrated in the accompanying drawings, and the specific dimension and number of each structure may be determined according to actual needs. The accompanying drawings in the present disclosure are only schematic structural diagrams.

At least one embodiment of the present disclosure provides a display panel, which includes a base substrate, a light-emitting element and a photoelectric conversion structure; the light-emitting element is disposed on the base substrate; the photoelectric conversion structure is disposed on the base substrate, and configured to receive a part of light emitted by the light-emitting element, convert energy of light received by the photoelectric conversion structure into electric energy, and supply the electric energy to the light-emitting element.

Figure 1A:
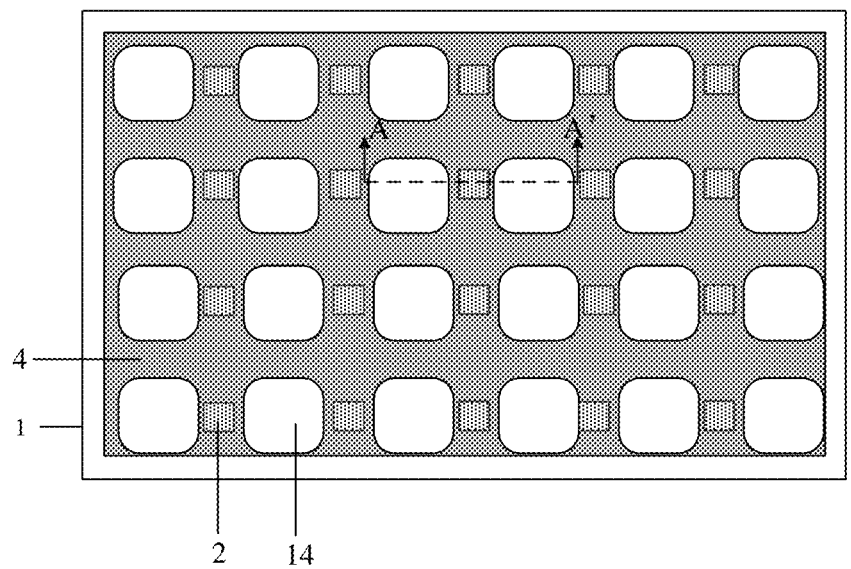
FIG. 1A is a schematic planar view of a display panel provided by an embodiment of the present disclosure.
Figure 1B:
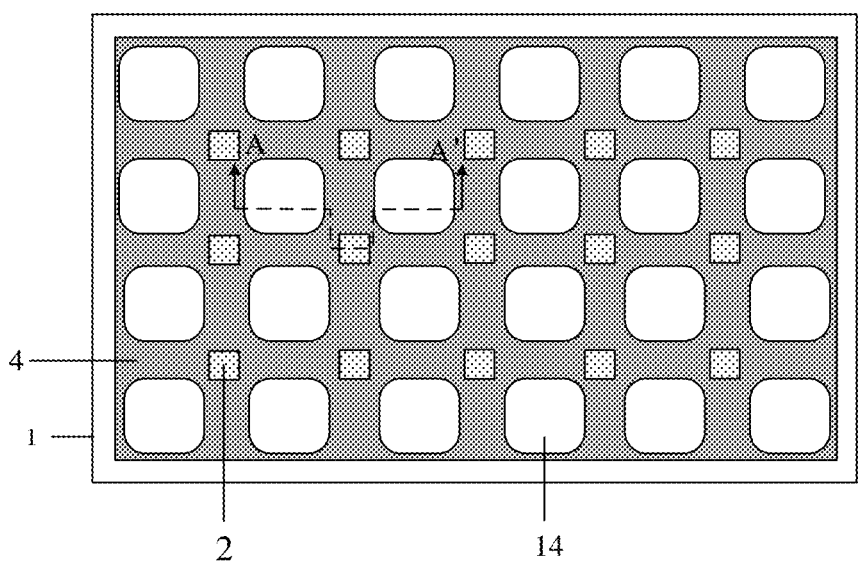
FIG. 1B is a schematic planar view of another display panel provided by an embodiment of the present disclosure.
Figure 1C:
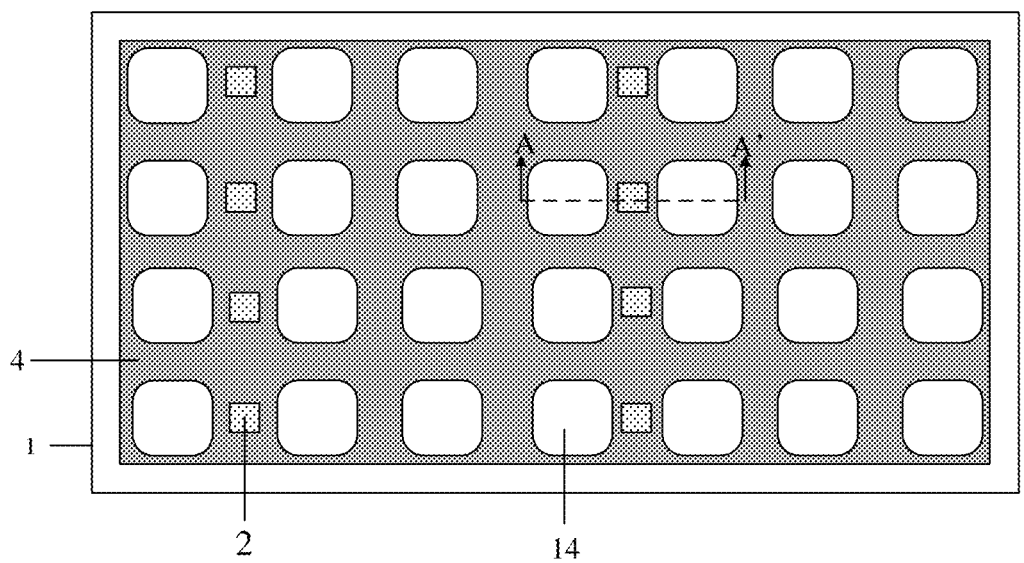
FIG. 1C is a schematic planar view of further another display panel provided by an embodiment of the present disclosure.
Figure 2A:
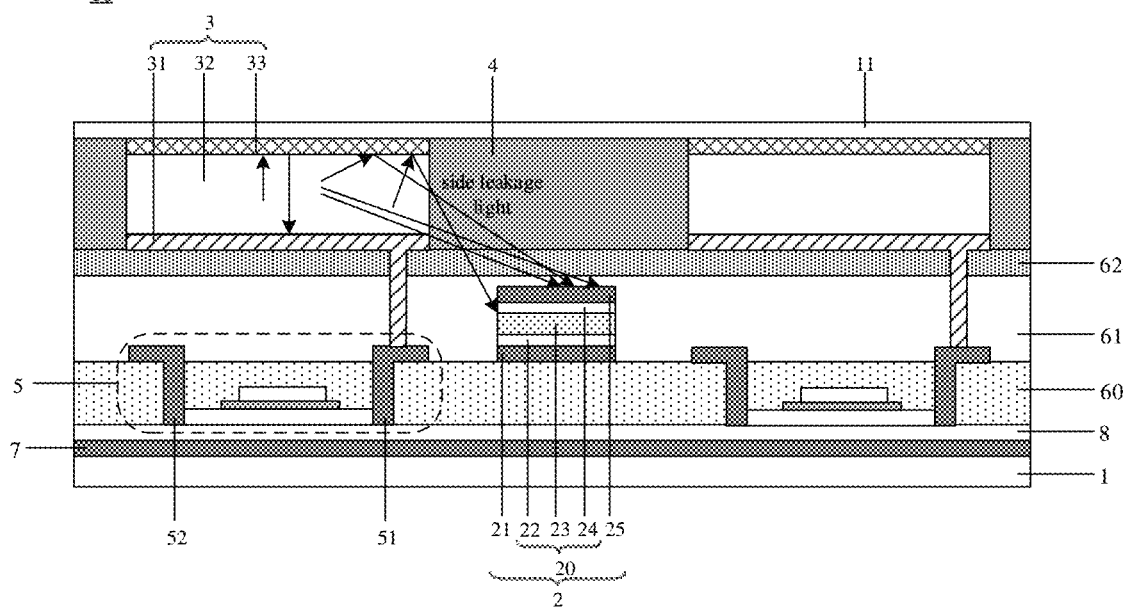
FIG. 2A is a schematic cross-sectional view taken along line A-A' in any one of FIGS. 1A-1C.

Exemplarily, FIG. 1A is a schematic planar view of a display panel provided by an embodiment of the present disclosure, FIG. 1B is a schematic plan view of another display panel provided by an embodiment of the present disclosure, FIG. 1C is a schematic plan view of further another display panel provided by an embodiment of the present disclosure, and FIG. 2A is a schematic cross-sectional view taken along line A-A' in any one of FIGS. 1A-1C. As illustrated in FIGS. 1A and 2A, the display panel 10 includes a base substrate 1, a photoelectric conversion structure 2 and a light-emitting element 3. The light-emitting element 3 is disposed on the base substrate 1. The photoelectric conversion structure 2 is disposed on the base substrate 1 and configured to receive a part of light emitted by the light-emitting element 3, convert energy of light received by the photoelectric conversion structure into electric energy, and supply the electric energy to the light-emitting element 3. For example, the electric energy can be supplied to a power supply of the display panel 10, and then the power supply supplies the electric energy to the light-emitting element 3. In the display panel provided by the present disclosure, for example, the photoelectric conversion structure 2 can convert energy of a side leakage light (as illustrated in FIG. 2A) from the light-emitting element 3 and then received by the photoelectric conversion structure into electric energy, and supply the electric energy to the light-emitting element 3 for emitting light, thereby improving the utilization rate of the light energy of the display panel and improving the endurance capability of the power supply of the display panel. The display panel 10 further includes a plurality of pixel units arranged in an array. For example, in one embodiment, the light-emitting element 3 is disposed in each pixel unit of the plurality of pixel units, and the photoelectric conversion structure 2 absorbs and utilizes at least a part of the side leakage light of the light-emitting element 3, and prevents the side leakage light of a pixel unit from causing interference to a display effect of adjacent pixel units. Of course, in other embodiments, the light-emitting element 3 may also be disposed in some pixel units of the plurality of pixel units.

For example, as illustrated in FIG. 2A, the photoelectric conversion structure includes a first electrode 21, a second electrode 25, and a photoelectric conversion layer 20. The first electrode 21 is disposed on the base substrate 1; the second electrode 25 is disposed on a side of the first electrode 21 away from the base substrate 1; the photoelectric conversion layer 20 is disposed between the first electrode 21 and the second electrode 25, and is configured to convert energy of light received by the photoelectric conversion layer into electric energy. The photoelectric conversion layer 20 can convert the side leakage light from the light-emitting element 3 into electric energy, and can conduct the generated electric energy to the power supply of the display panel 10 via the first electrode 21 and the second electrode 25, and finally supply power to the light-emitting element 3.

For example, the photoelectric conversion layer 20 is a PIN junction, which includes a P-type semiconductor layer 22, an N-type semiconductor layer 24 and an intrinsic semiconductor layer 23. The P-type semiconductor layer 22 is stacked with the N-type semiconductor layer 24, and the intrinsic semiconductor layer 23 is located between the P-type semiconductor layer 22 and the N-type semiconductor layer 24. Under light conditions, the PIN junction can produce photovoltaic effect, thus generating a current.

It should be noted that, in the display panel 10 illustrated in FIG. 2A, the P-type semiconductor layer 22 is on a side of the intrinsic semiconductor layer 23 close to the base substrate 1, and the N-type semiconductor layer 24 is on a side of the intrinsic semiconductor layer 23 away from the base substrate 1. However, in other embodiments of the present disclosure, the P-type semiconductor layer 22 is on the side of the intrinsic semiconductor layer 23 away from the base substrate 1, and the N-type semiconductor layer 24 is on the side of the intrinsic semiconductor layer 23 close to the base substrate 1.

Figure 3:
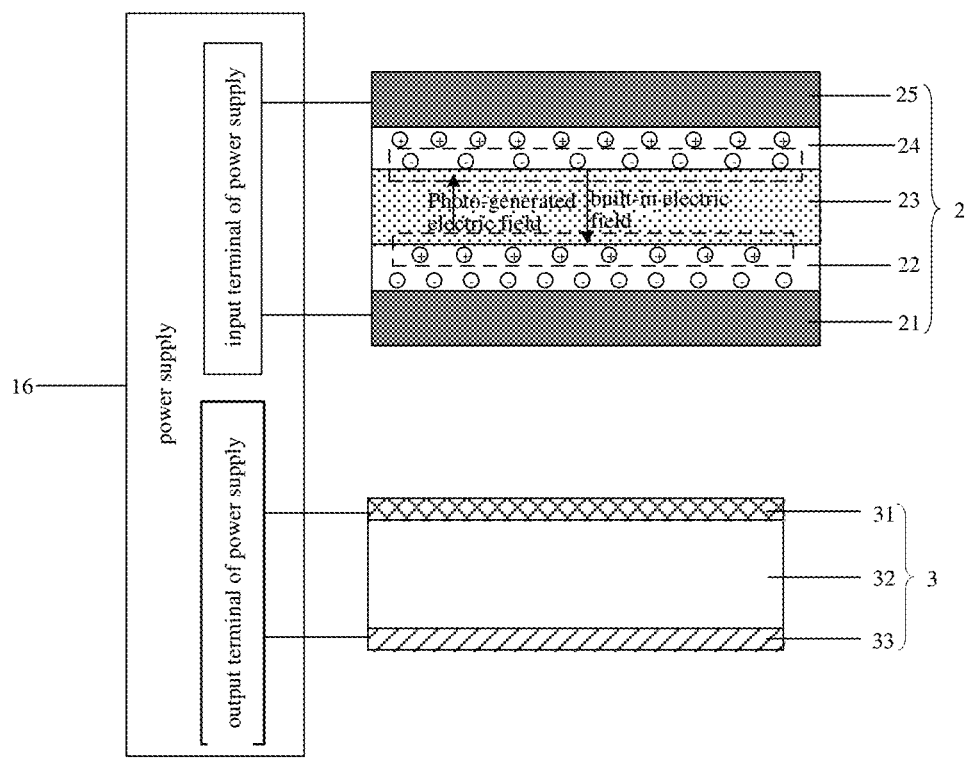
FIG. 3 is a schematic diagram illustrating the working principle of a photoelectric conversion structure in a display panel provided by an embodiment of the present disclosure.

FIG. 3 is a schematic diagram illustrating the working principle of the photoelectric conversion structure in a display panel provided by an embodiment of the present disclosure. For example, the display panel 10 further includes a power supply, which includes an input terminal for charging and an output terminal for supplying power. The light-emitting element 3 includes an anode 31, a light-emitting layer 32 and a cathode 33 which are disposed sequentially away from the base substrate 1. The first electrode 21 of the photoelectric conversion structure 2 and the second electrode 25 of the photoelectric conversion structure 2 are electrically connected to the input terminal of the power supply. The anode 31 of the light-emitting element 3 and the cathode 33 of the light-emitting element 3 are electrically connected to the output terminal (not illustrated in FIG. 3) of the power supply. The specific connection mode and wire arrangement can be designed by those skilled in the art according to conventional techniques in the art. For example, the light-emitting element 3 is a light-emitting diode element, such as an organic light-emitting diode (OLED) element, etc.

Referring to FIG. 3, when the PIN junction is illuminated, both intrinsic absorption and extrinsic absorption of photons of the PIN junction generate photo-generated carriers (electron-hole pairs). However, only carriers excited by the intrinsic absorption can cause photovoltaic effect. Both photo-generated holes generated in the P-type semiconductor layer 22 and photo-generated electrons generated in the N-type semiconductor layer 24 are majority carriers which are blocked by the barriers and cannot pass through the junction. Only photo-generated electrons in a P region (P-type semiconductor layer 22) and photo-generated holes in a N region (N-type semiconductor layer 24) and electron-hole pairs (minority carriers) in the junction region (intrinsic semiconductor layer 23) can drift over the junction under the action of a built-in electric field when diffusing to a vicinity of a junction electric field. The photo-generated electrons are pulled toward the N region and the photo-generated holes are pulled toward the P region, i.e., the electron-hole pairs are separated by the built-in electric field. This results in an accumulation of the photo-generated electrons near a boundary close to the junction in the N region and an accumulation of the photo-generated holes near a boundary close to the junction in the P region. They generate a photo-generated electric field opposite to the built-in electric field of the PIN junction, and the direction of the photo-generated electric field is from the P region to the N region. This photo-generated electric field lowers the potential barrier by an amount of a photo-generated potential difference. At this time, the Fermi levels are separated, thus generating a voltage drop. A traveling direction of electrons in the photo-generated carriers generated by the photovoltaic effect is: traveling from the P-type semiconductor layer 22 to the N-type semiconductor layer via the intrinsic semiconductor layer 23. And the first electrode 21 and the second electrode 25 that are located on both sides of the photoelectric conversion layer 3 are connected with the power supply of the display panel 10, so that current can be generated to charge the power supply. Compared with a PN junction, the intrinsic semiconductor layer in PIN junction can enlarge the junction region, thus increasing an average diffusion distance at the vicinity of the junction, which is beneficial to increasing the number of photo-generated carriers contributing to photocurrent and facilitates the transport of carriers contributing to photocurrent, thus improving photoelectric conversion efficiency.

For example, a material of the P-type semiconductor layer 22, a material of the N-type semiconductor layer 24 and a material of the intrinsic semiconductor layer 23 are all amorphous silicon. Because a temperature is relatively low in a process of manufacturing the structure in the display panel by adopting amorphous silicon, the manufacturing conditions are easy to reach, and performances of other functional layers (such as light-emitting elements, driving circuits and the like) of the display panel are not affected.

For example, the first electrode 21 is an opaque reflective electrode, and the second electrode 25 is a transparent electrode or an opaque reflective electrode. In the display panel 10 illustrated in FIG. 2A, in a case where both the first electrode 21 and the second electrode 25 are transparent electrodes, the photoelectric conversion structure 2 is located on the side of the light-emitting element 3 close to the base substrate 1. In this case, the side leakage light from the light-emitting element 3 can be irradiated to the photoelectric conversion layer 20 via the transparent second electrode 25, or can be irradiated to the photoelectric conversion layer 20 through a side surface of the photoelectric conversion structure 2 close to a corresponding light-emitting element, so that the photoelectric conversion layer 20 can absorb and utilize more side leakage light, which is beneficial to improving the light utilization rate. At the same time, the photoelectric conversion structure 2 simultaneously absorbs the ambient light irradiated to the photoelectric conversion layer 20 after passing through the transparent second electrode 25, so that the photoelectric conversion structure 2 simultaneously absorbs the ambient light in the external environment, converts the light energy of the absorbed ambient light into electric energy, and supplies the electric energy to the light-emitting element 3, thereby further improving the light utilization rate. In the case where both the first electrode 21 and the second electrode 25 are opaque reflective electrodes, light irradiated to the photoelectric conversion layer 20 from the side surface of the photoelectric conversion structure 2 (the surface of the photoelectric conversion structure 2 perpendicular to the base substrate in FIG. 2A) may be reflected multiple times between the first electrode 21 and the second electrode 25 without passing through the first electrode 21 or the second electrode 25, thereby increasing the absorption of light by the photoelectric conversion layer 20.

For example, in the case where the first electrode 21 is an opaque reflective electrode and the second electrode 25 is a transparent electrode, and for example, a material of the first electrode 21 is a metal material, such as Al, Cu, Mo, etc. For example, a material of the second electrode 25 is a transparent conductive material, such as indium tin oxide (ITO), indium zinc oxide (IZO), etc. In the case where both the first electrode 21 and the second electrode 25 are opaque reflective electrodes, the materials of both the first electrode 21 and the second electrode 25 may be the above-mentioned metal material. Of course, the materials of the first electrode and the second electrode in the embodiments of the present disclosure are not limited to the types listed above, and the present disclosure is not limited thereto.

As illustrated in FIGS. 1A and 2A, the display panel 10 further includes a plurality of pixel units 14 arranged in an array and a pixel definition layer 4. Each pixel unit of the plurality of pixel units 14 includes the light-emitting element 3; the pixel definition layer 4 is located between adjacent pixel units 14 in the plurality of pixel units 14 to define the plurality of pixel units 14. An orthographic projection of the photoelectric conversion structure 2 on the base substrate 1 is within an orthographic projection of the pixel definition layer 4 on the base substrate 1. Thus, the photoelectric conversion structure 2 does not affect the aperture ratio of the display panel 10. For example, in the display panel 10 provided by at least one embodiment of the present disclosure, the pixel definition layer 4 is light-transmitting, for example, the pixel definition layer 4 is transparent. Thus, on the one hand, the side leakage light from the light-emitting element 3 can enter the photoelectric conversion structure 2 after passing through the transparent pixel definition layer 4 and be utilized by the photoelectric conversion structure 2; on the other hand, the ambient light can enter the photoelectric conversion structure after passing through the transparent pixel definition layer 4 to be utilized by the photoelectric conversion structure 2. In this way, the light utilization rate is improved, which is also beneficial to better improving the endurance capability of the power supply of the display panel.

For example, a position of the photoelectric conversion structure 2 in the planar view of the display panel 10 is set according to actual application needs. For example, the display panel 10 can include a plurality of photoelectric conversion structures 2. As illustrated in FIG. 1A, each photoelectric conversion structure 2 is disposed between two adjacent pixel units 14; for another example, as illustrated in FIG. 1B, each photoelectric conversion structure 2 is disposed between four adjacent pixel units 14; for further another example, as illustrated in FIG. 1C, in the case where the demand for the charging speed and the charging amount of the power supply is relatively low, every three display pixels 14 correspond to one photoelectric conversion structure 2, thereby reducing the number and the manufacturing cost of the photoelectric conversion structures 2. Of course, it is not limited to that every three display pixels 14 correspond to one photoelectric conversion structure 2, and it can also be that every four display pixels 14 corresponds to one photoelectric conversion structure 2, and the like. That is, this can be designed as needed. FIGS. 1A, 1B and 1C illustrate only a few examples of the cases where the orthographic projection of the photoelectric conversion structure 2 on the base substrate 1 is within the orthographic projection of the pixel definition layer 4 on the base substrate 1. The embodiments of the present disclosure do not limit the specific position and arrangement manner of the photoelectric conversion structure 2.

For example, in an embodiment of the present disclosure, as illustrated in FIG. 2A, the photoelectric conversion structure 2 is on a side of the pixel definition layer 4 close to the base substrate 1, and is on a side of the light-emitting element 3 close to the base substrate 1. In this case, the side leakage light from the light-emitting element 3 can be incident to the photoelectric conversion structure 2 from a surface of the photoelectric conversion structure 2 away from the base substrate 1 and a side surface of the photoelectric conversion structure 2, and then be utilized by the photoelectric conversion layer 20 which converts light energy into electric energy and supplies the electric energy to the light-emitting element 3 for emitting light.

For example, as illustrated in FIG. 2A, the display panel 10 further includes a driving circuit layer configured to drive the plurality of pixel units 14, the driving circuit layer includes a pixel driving circuit for driving pixels, the pixel driving circuit includes a thin film transistor 5, and the first electrode 21 of the photoelectric conversion structure 2 is disposed in a same layer as a drain electrode 51 of the thin film transistor 5 and a source electrode 52 of the thin film transistor 5, which is beneficial to simplifying the structure of the display panel 10 and the thinning of the display panel 10, and is also beneficial to simplifying the manufacturing process of the display panel 10. It should be noted that the feature "the first electrode 21 of the photoelectric conversion structure 2 being disposed in the same layer as the drain electrode 51 of the thin film transistor 5 and the source electrode 52 of the thin film transistor 5" means that the first electrode 21 of the photoelectric conversion structure 2, the drain electrode 51 of the thin film transistor 5 and the source electrode 52 of the thin film transistor 5 are formed by performing one same patterning process on a same layer, and no any other layer is between the first electrode 21 of the photoelectric conversion structure 2 and the layer constituted by the drain electrode 51 of the thin film transistor 5 and the source electrode 52 of the thin film transistor 5 in a direction perpendicular to the base substrate.

For example, a material of the semiconductor layer of the thin film transistor 5 is low-temperature polysilicon, so that the manufacturing process of the photoelectric conversion structure (e.g., PIN) has less influence on the performance of the semiconductor layer of the thin film transistor 5.

For example, in the display panel, in the case where the orthographic projection of the thin film transistor on the base substrate is within the orthographic projection of the pixel definition layer on the base substrate, the photoelectric conversion structure can further prevent the side leakage light from the light-emitting element from irradiating the channel region of the thin film transistor, or reduce the phenomenon that the side leakage light from the light-emitting element irradiates the channel region of the thin film transistor.

It should be noted that the side leakage light in the embodiments of the present disclosure includes light directly emitted from the light-emitting layer 32, light reflected by the cathode 33 and then emitted from the side surface of the light-emitting element close to the pixel definition layer 4, and light reflected by the anode 31 and then emitted from the side surface of the light-emitting element close to the pixel definition layer 4.

For example, as illustrated in FIG. 2A, the light-emitting element 3 is of a top emission type, and at least part of an orthographic projection of the thin film transistor 5 on the base substrate 1 overlaps with an orthographic projection of the light-emitting element 3 on the base substrate. In the top emission structure, in this way, the light-emitting element 3 can shield the channel region of the thin film transistor 5 so as to prevent the performance of the thin film transistor 5 from being affected by illumination on the channel region.

For example, in other embodiments of the present disclosure, the light-emitting element can also be of a bottom emission type, and in this case, the thin film transistor, for example, is configured that the orthographic projection of the thin film transistor on the base substrate is within the orthographic projection of the pixel definition layer on the base substrate, and further, the thin film transistor can be configured that the orthographic projection of the thin film transistor on the base substrate is within the orthographic projection of the photoelectric conversion structure on the base substrate. In this way, the channel region of the thin film transistor is shielded by the photoelectric conversion structure to prevent the light from the light-emitting element from irradiating the channel region of the thin film transistor. Alternatively, a thin film transistor of a top gate type is adopted, and the gate electrode shades the channel region of the thin film transistor. Alternatively, a light shielding layer is separately provided for the channel region of the thin film transistor. Those skilled in the art can design according to the actual situations.

For example, the photoelectric conversion structure 2 and the pixel driving circuit are insulated from each other, and the photoelectric conversion structure 2 and the light-emitting element 3 are insulated from each other. For example, the photoelectric conversion structure 2 is not in direct contact with the pixel driving circuit. For example, a first insulation layer 60 is provided between the photoelectric conversion structure 2 and the pixel driving circuit so as to insulate the photoelectric conversion structure 2 from portions of the pixel driving circuit other than the drain electrode and the source electrode of the thin film transistor, and a planarization layer 61 and a second insulation layer 62 are provided between the photoelectric conversion structure 2 and the light-emitting element 3 to prevent the photoelectric conversion structure 2 and the light-emitting element 3 from being conducted with each other. Meanwhile, a thickness of the second insulation layer 62 between the photoelectric conversion structure 2 and the light-emitting element 3 can be adjusted to ensure that there is no influence of parasitic capacitance therebetween. Exemplarily, the thickness of the second insulation layer 62 between the photoelectric conversion structure 2 and the light-emitting element 3 is 3 µm~6 µm.

For example, an electric wire (not illustrated) for connecting the photoelectric conversion structure 2 and the power supply is disposed between the second insulation layer 62 and the planarization layer 61, and of course, a wiring layer may be separately set, and those skilled in the art may select according to actual needs.

For example, the display panel 10 further includes a thin film encapsulation layer 11, and the thin film encapsulation layer 11 covers the plurality of pixel units 14 and the pixel definition layer 4 to prevent substances, such as water vapor, oxygen and the like, from contacting the light-emitting element 3 to affect the service life of the light-emitting element 3. Those skilled in the art can select the type of the thin film encapsulation layer 11 according to conventional techniques in the art.

Figure 2B:
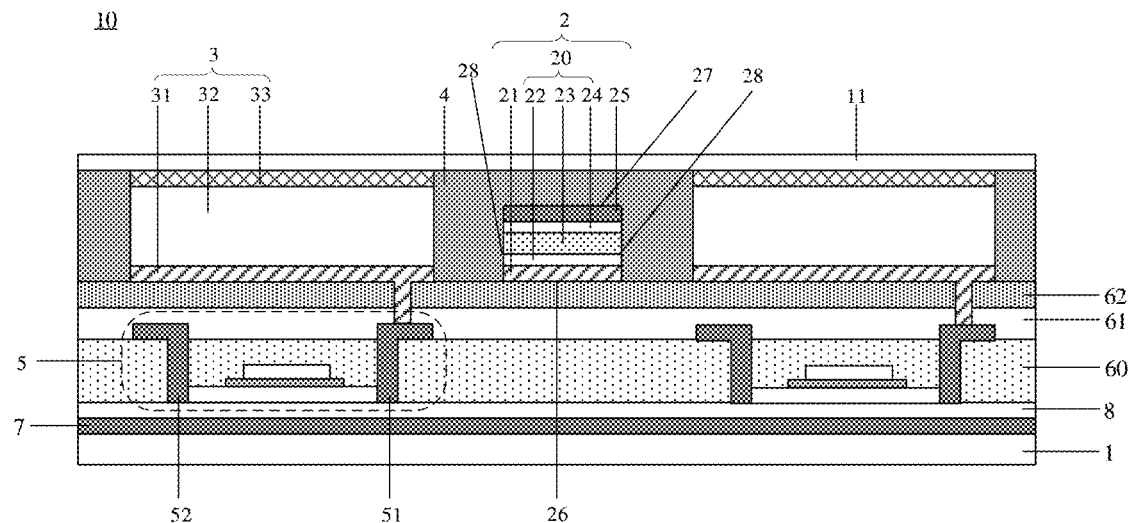
FIG. 2B is another schematic cross-sectional view taken along line A-A' in any one of FIGS. 1A-1C.

In another example of the present disclosure, the photoelectric conversion structure is in the pixel definition layer, that is, the photoelectric conversion structure is inside the pixel definition layer. For example, FIG. 2B is another schematic cross-sectional view taken along line A-A' in any one of FIGS. 1A-1C. The display panel illustrated in FIG. 2B differs from the display panel illustrated in FIG. 2A in that a distance between a lower surface 26 of the photoelectric conversion structure 2 facing the base substrate 1 and the base substrate 1, a distance between a surface of the light-emitting element 3 facing the base substrate 1 and the base substrate 1, and a distance between a surface of the pixel definition layer 4 facing the base substrate 1 and the base substrate 1, are equal to each other. In this case, the side leakage light from the light-emitting element 3 is mainly incident to the photoelectric conversion layer 20 from the side surface of the photoelectric conversion structure 2, and the structure in which the photoelectric conversion structure 2 is inside the pixel definition layer 4 is beneficial to thinning the display panel 10, and the thickness of the display panel 10 is not additionally increased because of the arrangement of the photoelectric conversion structure 2. For example, the photoelectric conversion structure 2 is inside the pixel definition layer 4, the pixel definition layer 4 covers an upper surface 27 of the photoelectric conversion structure 2 facing away from the base substrate 1 and a side surface 28 of the photoelectric conversion structure 2 intersected with the upper surface thereof. Thus, while achieving the effect of thinning the display panel 10, the pixel definition layer 4 can also protect the photoelectric conversion structure 2.

For example, as illustrated in FIG. 2B, the first electrode 21 is in a same layer as the anode 31 of the light-emitting element 3, which is beneficial to simplifying the structure of the display panel 10 and thinning the display panel 10, as well as simplifying the manufacturing process of the display panel 10. It should be noted that, the feature "the first electrode 21 being disposed in a same layer as the anode 31 of the light-emitting element 3" means that the first electrode 21 and the anode 31 of the light-emitting element 3 are formed by performing one same patterning process on a same layer, and no any other layer is between the layer constituted by the first electrode 21 and the anode 31 of the light-emitting element 3 in the direction perpendicular to the base substrate.

Other features of the display panel illustrated in FIG. 2B are the same as those in FIG. 2A, please refer to the previous description and details are not repeated here.

Figure 2C:
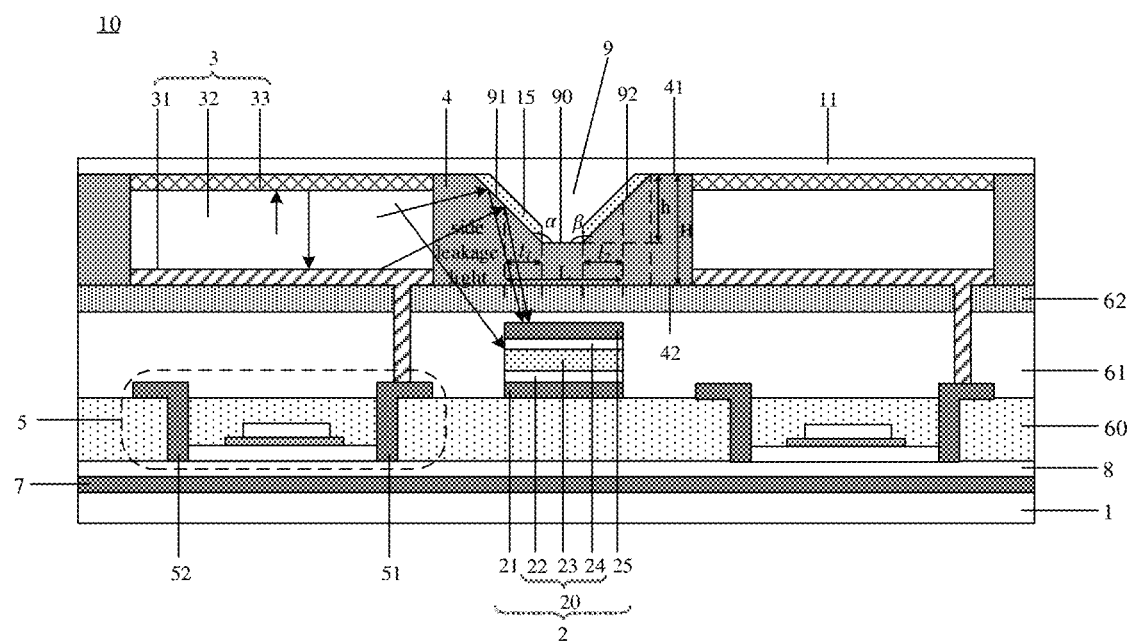
FIG. 2C is further another schematic cross-sectional view taken along line A-A' in any one of FIGS. 1A-1C.

For example, FIG. 2C is further another schematic cross-sectional view taken along line A-A' in any one of FIGS. 1A-1C. The display panel illustrated in FIG. 2C differs from the display panel illustrated in FIG. 2A in that the pixel definition layer 4 includes a groove 9 which includes a bottom surface 90 parallel to the base substrate 1 and a side surface intersected with the bottom surface 90. For example, the groove 9 includes a plurality of the side surfaces, such as a first side surface 91 and a second side surface 92, and the orthographic projection of the photoelectric conversion structure 2 on the base substrate 1 is within an orthographic projection of the whole constituted by the bottom surface 90 and the side surfaces on the base substrate 1. The groove 9 is configured that a part of light emitted from the light-emitting layer 32 (for example, the side leakage light) is reflected by the side surface of the groove and then incident to the photoelectric conversion structure 2. Compared with the display panel illustrated in FIG. 2B, the groove 9 enables more side leakage light from the light-emitting layer 20 to enter the photoelectric conversion structure 2 and be utilized by the photoelectric conversion structure 2, thus being beneficial to increasing the light utilization rate and improving the endurance capability of the power supply of the display panel.

For example, an included angle between the side surface and the bottom surface 90 of the groove 9 is an obtuse angle. For example, both an included angle $\alpha$ between the first side surface 91 and the bottom surface 90 and an included angle $\beta$ between the second side 92 and the bottom surface 90 are obtuse angles. In this way, more side leakage light incident to the side surface can meet the total reflection condition to generate total reflection, so that more side leakage light can be incident to the photoelectric conversion structure 2 to be utilized, and the light utilization rate can be improved.

For example, a range of the included angle between the side surface and the bottom surface 90 of the groove 9 is 110°~170°. For example, a range of the included angles between the plurality of side surfaces and the bottom surface 90 are all 110°~170°. For example, both angle $\alpha$ and angle $\beta$ are 110°~170°. The orthographic projections of the side surfaces on the base substrate 1 are respectively overlapped with a part of the orthographic projection of the photoelectric conversion structure 2 on the base substrate 1, and a width of the overlapped part in a direction parallel to the base substrate 1 is ⅓ of a width of the orthographic projection of the photoelectric conversion structure 2 on the base substrate 1 in the direction parallel to the base substrate 1. For example, aa width $l_1$ of the overlapped part of the orthographic projection of the first side surface 91 on the base substrate 1 and the orthographic projection of the photoelectric conversion structure 2 on the base substrate 1 in the direction parallel to the base substrate 1 is ⅓ of a width L of the orthographic projection of the photoelectric conversion structure 2 on the base substrate 1 in the direction parallel to the base substrate 1, and a width $l_2$ of the overlapped part of the orthographic projection of the second side surface 92 on the base substrate 1 and the orthographic projection of the photoelectric conversion structure 2 on the base substrate 1 in the direction parallel to the base substrate 1 is ⅓ of the width L of the orthographic projection of the photoelectric conversion structure 2 on the base substrate 1 in the direction parallel to the base substrate 1. In a direction perpendicular to the base substrate 1, a rest portion of the pixel definition layer 4 other than the groove 9 has a first surface 41 away from the base substrate 1 and a second surface 42 close to the base substrate 1, and a distance h between the bottom surface 90 and the first surface 41 of the pixel definition layer 4 is larger than ⅔ of a distance H between the second surface 42 of the pixel definition layer 4 and the first surface 41 of the pixel definition layer 4. In this case, more light can be reflected to the photoelectric conversion structure 2 by the side surfaces of the groove, thereby improving the light utilization rate.

For example, as illustrated in FIG. 2C, the display panel 10 further includes a reflective structure 15 disposed on at least a part of the side surface of the groove. For example, in FIG. 2C, the reflective structure 15 is disposed on the entire first side surface 91 and the entire second side surface 92. In other embodiments, the reflective structure 15 is disposed on a part of the first side surface 91 and a part of the second side surface 92. The reflective structure 15 can increase the reflectivity of the side leakage light on the side surface of the groove so that more light is incident on the photoelectric conversion structure 2, thereby improving the light utilization rate. For example, the reflective structure 15 is a reflective film, such as a metal reflective film. A material of the metal reflective film can be, for example, copper, aluminum, copper alloy or aluminum alloy, etc. For example, in the case where the cathode 33 is formed of a metal material, the reflective structure 15 is made of the same material as the cathode 33 by one same patterning process at the same time.

Other features of the display panel illustrated in FIG. 2C are the same as those in FIG. 2A, please refer to the previous description and details are not repeated here.

Figure 2D:
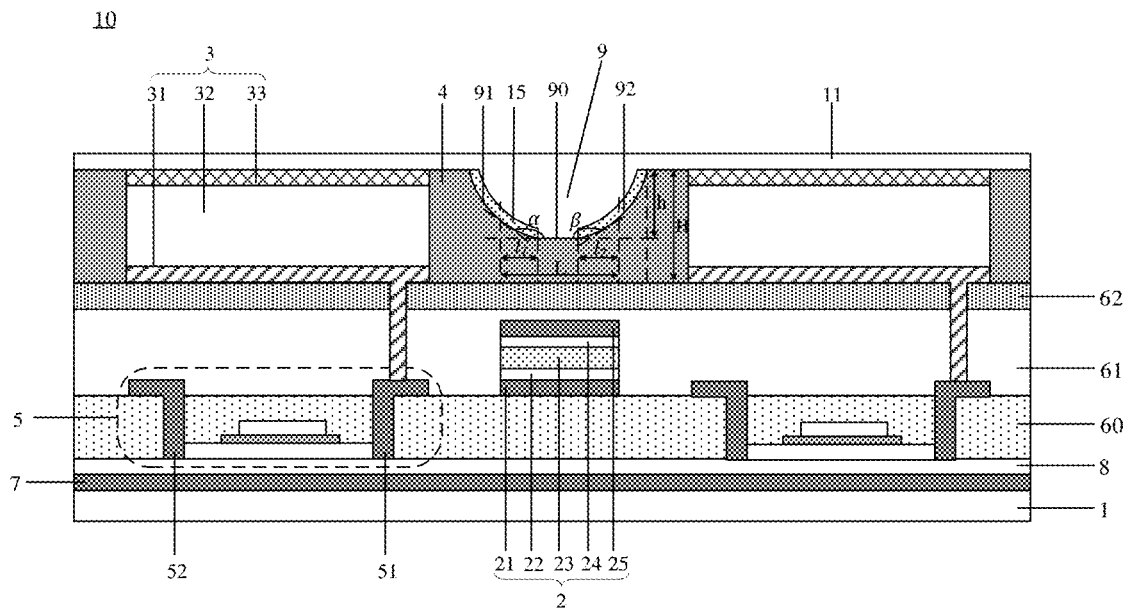
FIG. 2D is still another schematic cross-sectional view taken along line A-A' in any one of FIGS. 1A-1C.

For example, FIG. 2D is still another schematic cross-sectional view taken along line A-A' in any one of FIGS. 1A-1C. The display panel illustrated in FIG. 2D differs from the display panel illustrated in FIG. 2C in that the side surface is a curved surface recessed toward a direction away from the bottom surface 90, and an included angle between a tangent line of the curved surface and the bottom surface 90 of the groove 9, such as the angle α and the angle β, is an obtuse angle. The curved surface can enable light with the same propagation direction to have different incident angles at different positions on the side surface of the groove, thereby enabling more light to meet the total reflection condition and generate total reflection.

Figure 4:
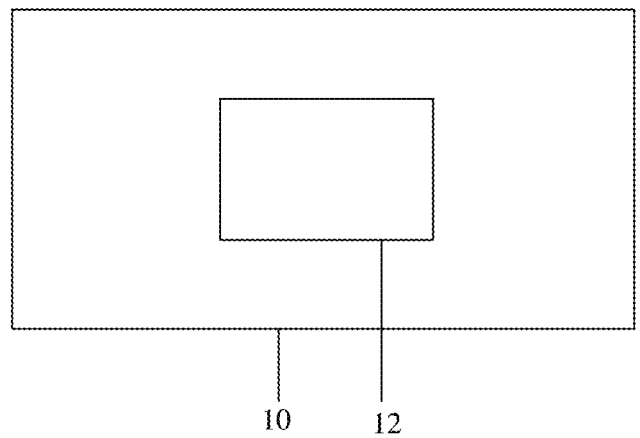
FIG. 4 is a schematic planar view of a display panel provided with a region for a photoelectric conversion structure provided by an embodiment of the present disclosure.

FIG. 4 is a schematic plan view of a display panel provided with a photoelectric conversion structure according to an embodiment of the present disclosure. As illustrated in FIG. 4, in the display panel, the photoelectric conversion structure is disposed in a photoelectric conversion region 12. For example, in the example illustrated in FIG. 1A, the photoelectric conversion region 12 corresponds to a part of the display region of the display panel 10. Of course, in other examples, the photoelectric conversion region 12 may correspond to the entire display region of the display panel to increase an area of the photoelectric conversion region and convert more light energy into electric energy to improve the charging amount and speed of the power supply.

At least one embodiment of the present disclosure further provides a display device, and the display device includes any one of the display panels provided by the embodiments of the present disclosure.

Figure 5:
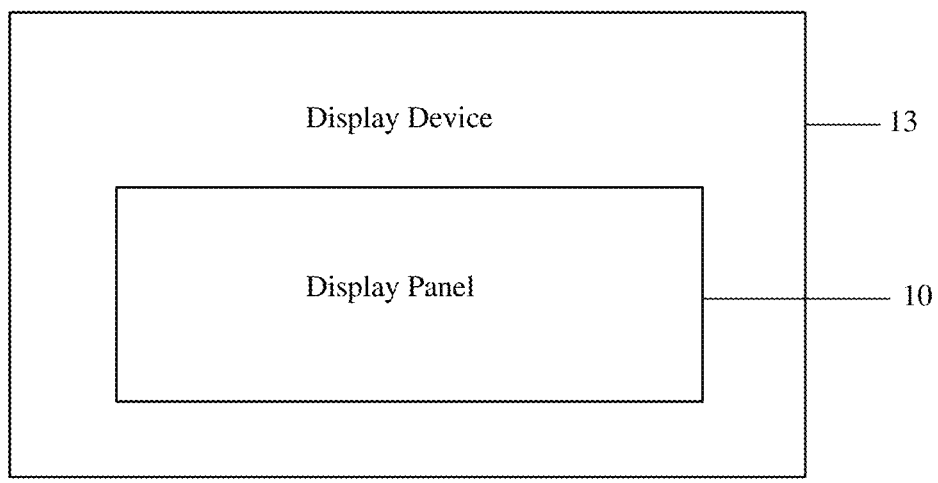
FIG. 5 is a schematic diagram of a display device provided by an embodiment of the present disclosure.

For example, FIG. 5 is a schematic diagram of a display device provided by an embodiment of the present disclosure. As illustrated in FIG. 5, the display device 13 includes any of the display panels 10 provided by the embodiments of the present disclosure. The display device provided by the embodiments of the disclosure can convert side leakage light (as illustrated in FIG. 2A) from the light-emitting element and received by the photoelectric conversion structure into electric energy by the photoelectric conversion structure and supply the electric energy to the light-emitting element for emitting light, thereby improving the light energy utilization rate of the display panel and improving the endurance capability of the power supply. At the same time, it can prevent the side leakage light of pixel units of the display panel from causing interference to adjacent pixel units.

For example, the display device 13 is a light-emitting diode display device or the like, such as an organic light-emitting diode display device. For example, the display device 13 may be implemented as any product or component having a display function, such as a mobile phone, a tablet computer, a television, a display, a notebook computer, a digital photo frame, a navigator, an electronic advertisement screen, etc.

FIG. 5 is merely a schematic diagram of a display device including any one of the display panels provided by the embodiments of the present disclosure, and does not show other structures of the display device. Those skilled in the art can refer to conventional technologies, and the present embodiment is not limited thereto.

At least one embodiment of the present disclosure further provides a manufacturing method of a display panel, and the method includes: providing a base substrate, and forming a light-emitting element and a photoelectric conversion structure on the base substrate, wherein the photoelectric conversion structure is configured to receive a part of light emitted by the light-emitting element, convert energy of light received by the photoelectric conversion structure into electric energy, and supply the electric energy to the light-emitting element.

Exemplarily, FIGS. 6A-6L are schematic diagrams of a manufacturing method of a display panel provided by an embodiment of the present disclosure.

Figure 6A:
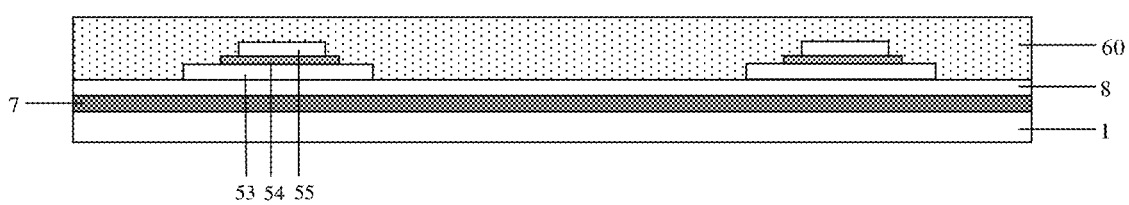
FIGS. 6A-6L are schematic diagrams of a manufacturing method of a display panel provided by an embodiment of the present disclosure.

As illustrated in FIG. 6A, a base substrate 1 is provided. For example, in the case where a flexible display panel is manufactured, a flexible layer 7 and a buffer layer 8 are sequentially formed on the base substrate 1. For example, a material of the flexible layer 7 is polyimide (PI), and a material of the buffer layer 8 is an inorganic material, such as silicon oxide, silicon nitride or silicon oxynitride, etc. A semiconductor layer 53, a gate insulation layer 54 and a gate electrode 55 of the thin film transistor (taking a top gate type thin film transistor as an example) are sequentially formed on the buffer layer 8 by a semiconductor process. For example, a material of the semiconductor layer 53 of the thin film transistor 5 is low-temperature polysilicon, so that the subsequent manufacturing process of the photoelectric conversion structure (e.g., PIN) has less influence on the performance of the semiconductor layer of the thin film transistor. A first insulation layer 60 covering the semiconductor layer 53, the gate insulation layer 54 and the gate electrode 55 is then formed, and a surface of the first insulation layer 60 away from the base substrate 1 is flat, so as to facilitate subsequent manufacturing of a photoelectric conversion structure on the surface.

Figure 6B:
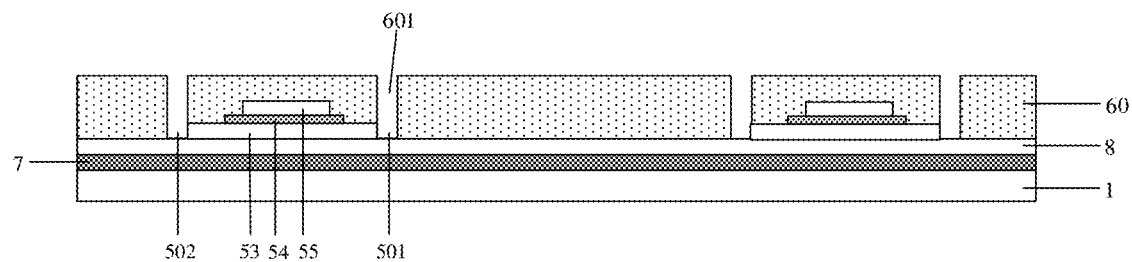

As illustrated in FIG. 6B, a first via hole 601 exposing the semiconductor layer 53 is formed in the first insulation layer 60 by a patterning process such as a photolithography process.

Figure 6C:
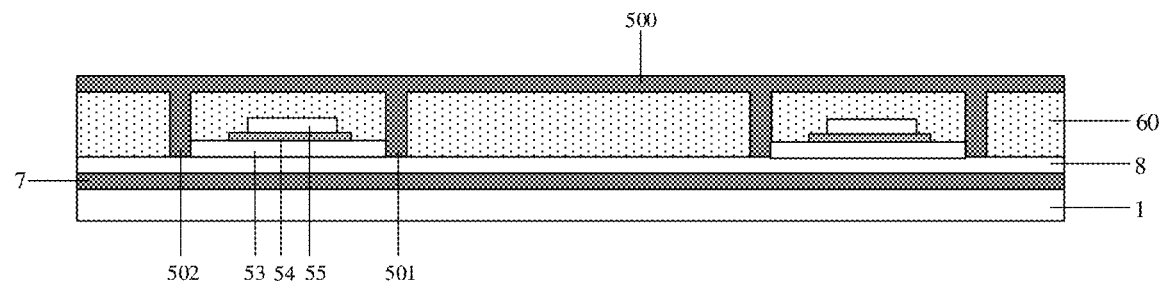

As illustrated in FIG. 6C, a first metal layer 500 is formed on the first insulation layer 60, and the first metal layer 500 is in contact with the semiconductor layer 53 of the thin film transistor through the first via hole 601. For example, the first metal layer 500 is formed by vapor deposition or chemical vapor deposition. For example, a material of the first metal layer 500 can be copper, aluminum, copper alloy or aluminum alloy, etc. Of course, the material of the first metal layer 500 is not limited to the above listed types, and the embodiments of the present disclosure are not limited thereto.

Figure 6D:
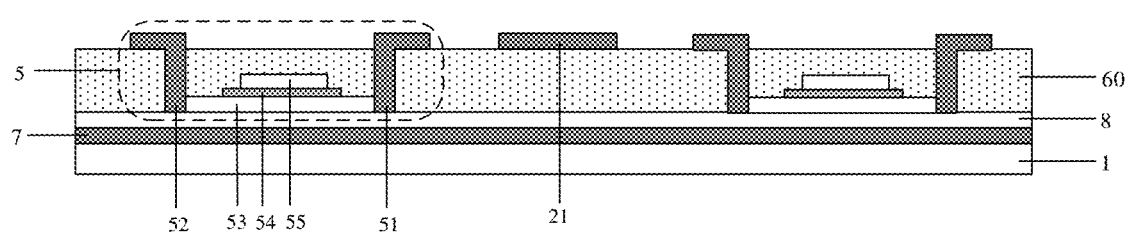

As illustrated in FIG. 6D, a first electrode 21 of the photoelectric conversion structure, a drain electrode 51 and a source electrode 52 of the thin film transistor are simultaneously formed by one same patterning process, and the drain electrode 51 and the source electrode 52 are in contact with the semiconductor layer 53 through the first via hole 601, which is beneficial to simplifying the manufacturing process. For example, the first electrode 21, the drain electrode 51 and the source electrode 52 of the thin film transistor are simultaneously formed using the first metal layer 500 by a photolithography process.

Figure 6E:
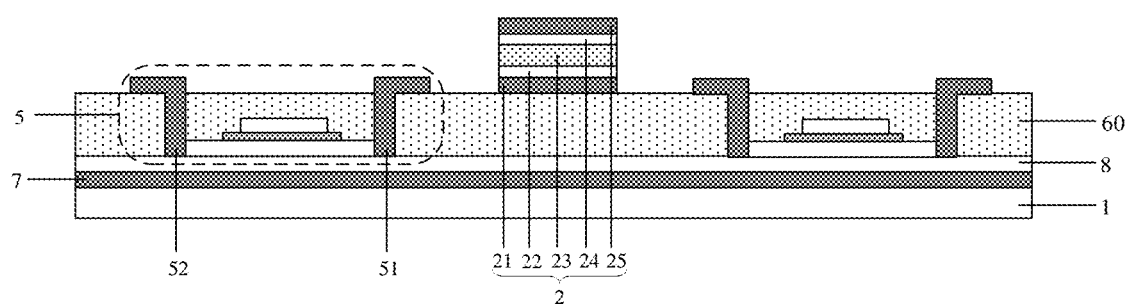

As illustrated in FIG. 6E, a second electrode 25 stacked with the first electrode 21, and a photoelectric conversion layer 20 between the first electrode 21 and the second electrode 25 are formed. For example, the photoelectric conversion layer 20 is a PIN junction, and forming the photoelectric conversion layer 20 includes sequentially forming a P-type semiconductor layer 22, an intrinsic semiconductor layer 23, and an N-type semiconductor layer 24 on the first electrode 21 by a semiconductor process. Then, the second electrode 25 is formed on the semiconductor layer 24 by a patterning process, thereby obtaining the photoelectric conversion structure 2. The materials of the first electrode 24 and the second electrode 25 can be referred to the description of the previous embodiments and details will not be described here again. The specific steps of the patterning process for forming the second electrode 25 can be designed by those skilled in the art according to the specific material of the second electrode 25.

Figure 6F:
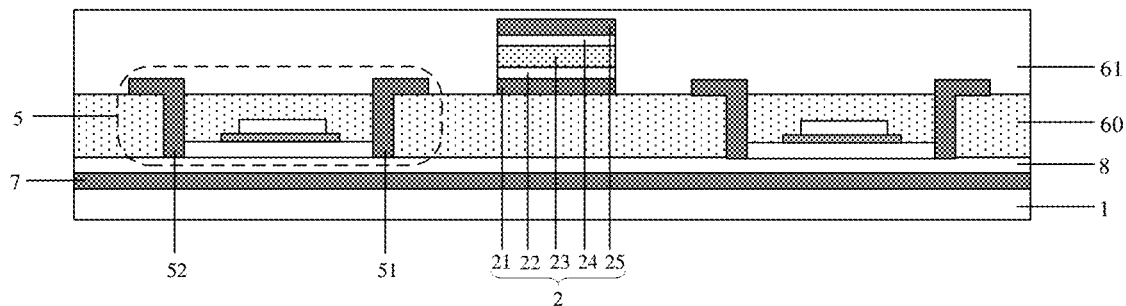

As illustrated in FIG. 6F, a planarization layer 60 covering the photoelectric conversion structure 2 is formed. For example, a material of the planarization layer 60 is silicon oxide, silicon nitride or silicon oxynitride, etc. For example, the planarization layer 60 can be formed by chemical vapor deposition or vapor deposition.

Figure 6G:
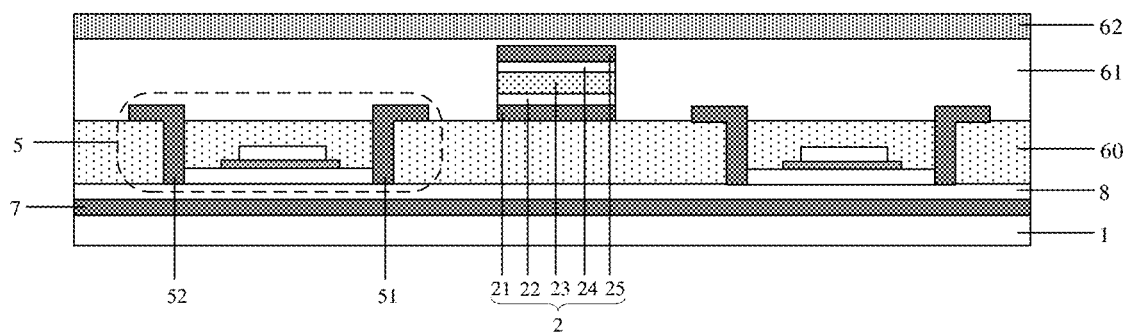

As illustrated in FIG. 6G, a second insulation layer 62 is formed on the planarization layer 60. For example, a material of the second insulation layer 62 is an inorganic insulation material or an organic insulation material, and can be referred to conventional techniques in the art. For example, a wire for connecting the first electrode 21 and the second electrode 25 to an input terminal of a power supply of the display panel is provided in the second insulation layer 62.

Figure 6H:
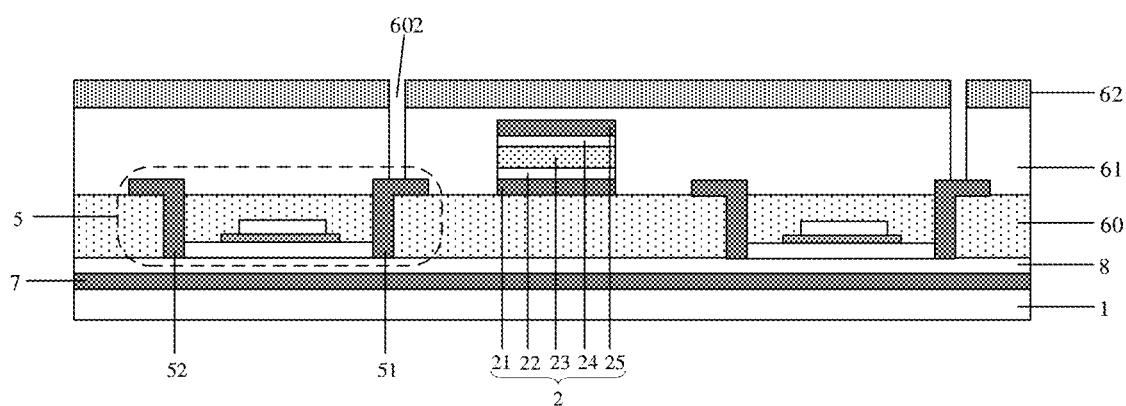

As illustrated in FIG. 6H, a second via hole 602 exposing the drain electrode 51 is formed in the planarization layer 60 and the second insulation layer 62. For example, the second via hole 602 is formed by a photolithography process.

Figure 6I:
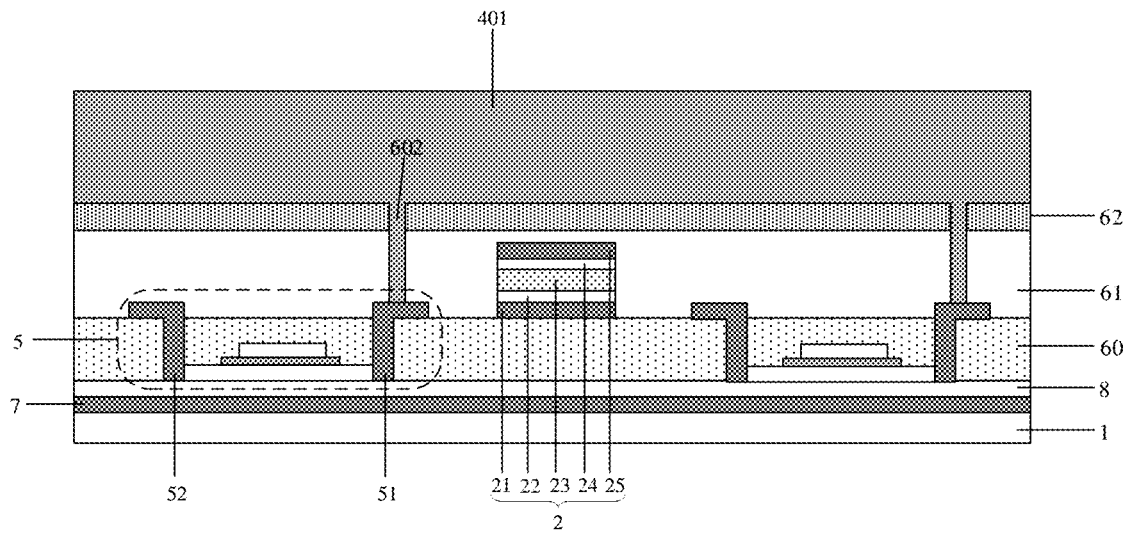

As illustrated in FIG. 6I, a pixel definition material layer 401 is formed on the second insulation layer 62 for forming a pixel definition layer. The material of the pixel definition material layer 401 can be a transparent organic material, such as a transparent resin, or can be a transparent inorganic material, such as silicon nitride, silicon oxide or silicon oxynitride, etc.

Figure 6J:
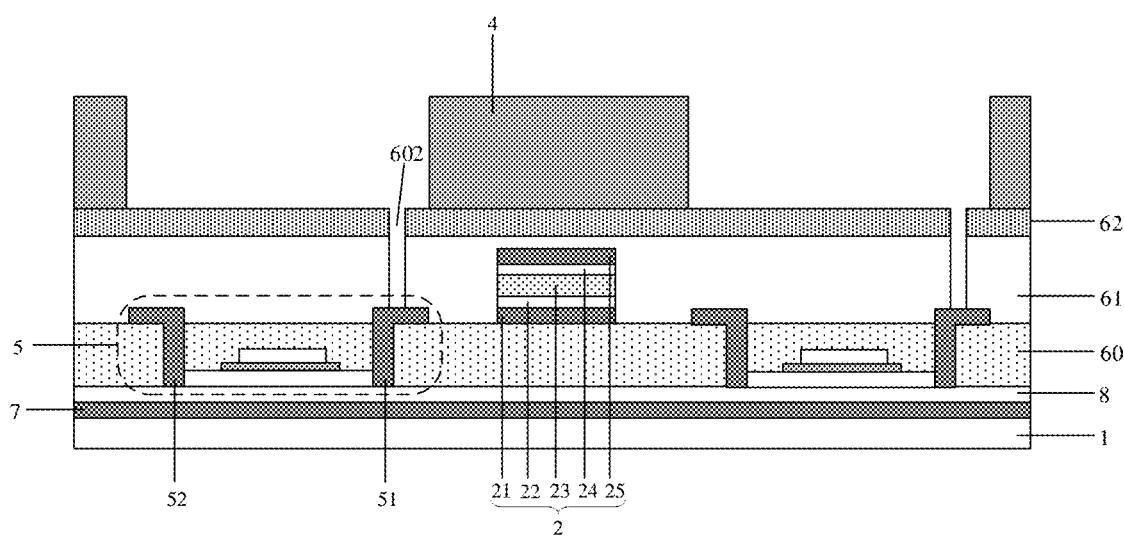

As illustrated in FIG. 6J, a patterning process is performed on the pixel definition material layer 401 to form a pixel definition layer 4, which defines a plurality of pixel units.

Figure 6K:
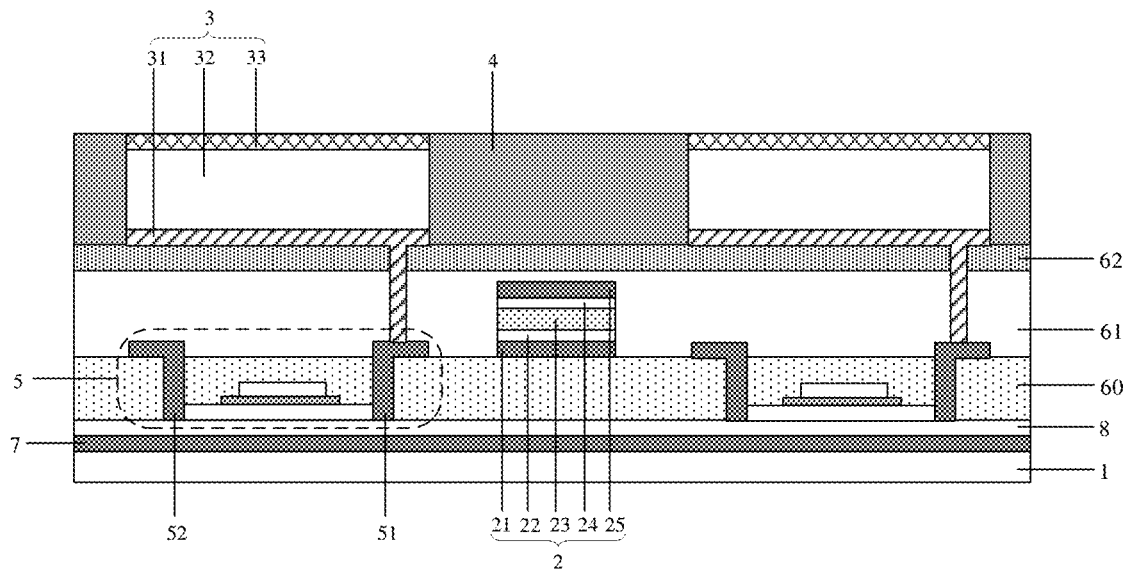

As illustrated in FIG. 6K, a light-emitting element is formed in each pixel unit of the plurality of pixel units, and the light-emitting element is described by taking an OLED element as an example. An anode 31, a light-emitting layer 32 and a cathode 33 are sequentially formed in each of the plurality of pixel units, and specific methods can be referred to conventional techniques by those skilled in the art.

Figure 6L:
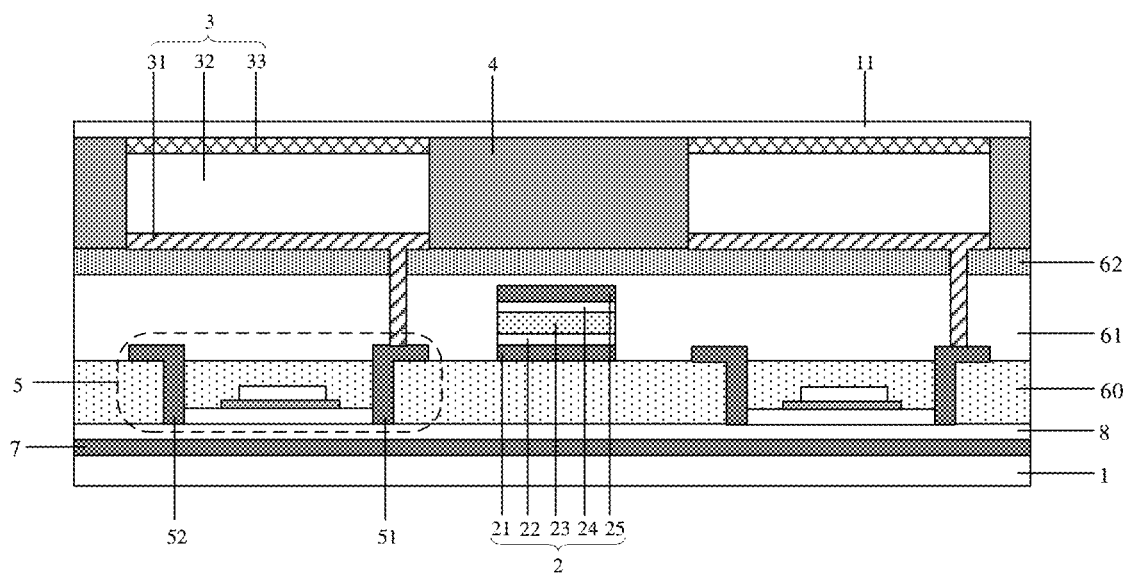

The OLED element is encapsulated to obtain a display panel as illustrated in FIG. 6L. For example, a thin film encapsulation layer 11 is used to cover the OLED element and the pixel definition layer to prevent substances, such as water vapor and oxygen, etc., from contacting the OLED element.

It should be noted that the order of each step is not limited in the present disclosure, as long as the final required structure can be obtained. For example, the pixel definition layer 4 can be formed before the second via hole 602 is formed.

The embodiment of the present disclosure mainly describes the main steps of forming a display panel including the photoelectric conversion structure, and other process steps can be referred to conventional technologies in the art.

FIGS. 7A-7E are schematic diagram of another manufacturing method of a display panel provided by an embodiment of the present disclosure. This method differs from the method illustrated in FIGS. 6A-6L in that the steps illustrated in FIGS. 7A-7E are executed after the steps illustrated in FIGS. 6A-6I are executed.

Figure 7A:
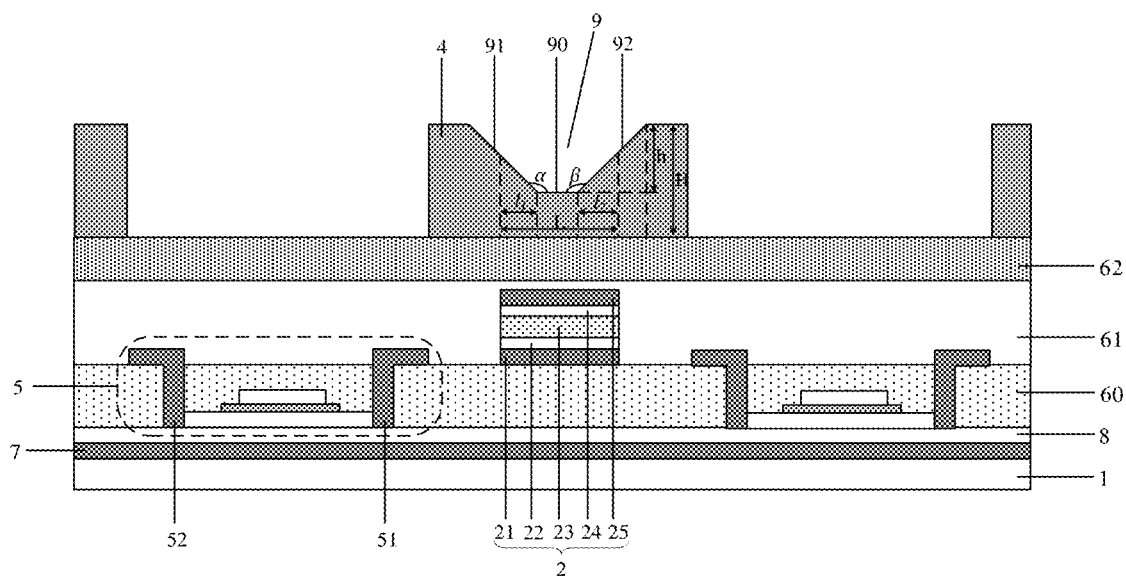
FIGS. 7A-7E are schematic diagrams of another manufacturing method of a display panel provided by an embodiment of the present disclosure.
Figure 7B:
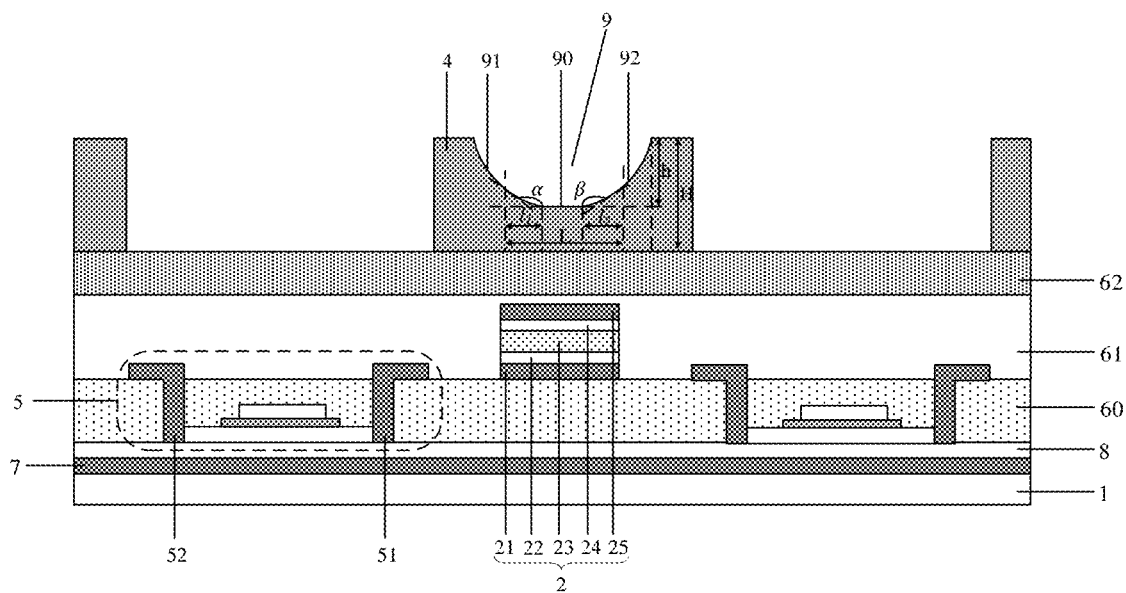

As illustrated in FIG. 7A, a patterning process is performed on the pixel definition material layer 401 illustrated in FIG. 6I, such as a photolithography process, to form the pixel definition layer 4 including a groove 9, or to form a groove 9 having a curved surface as illustrated in FIG. 7B. The features of the groove 9 can be referred to the description of the previous embodiments and details are not described here again.

Figure 7C:
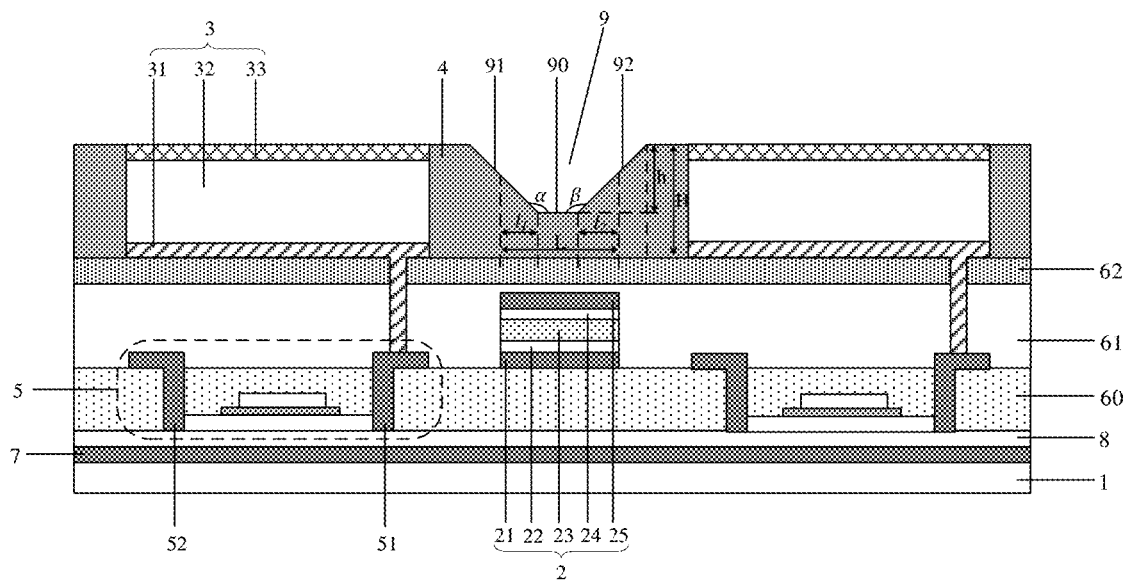

As illustrated in FIG. 7C, a light-emitting element is formed by the same method as that in FIG. 6K.

Figure 7D:
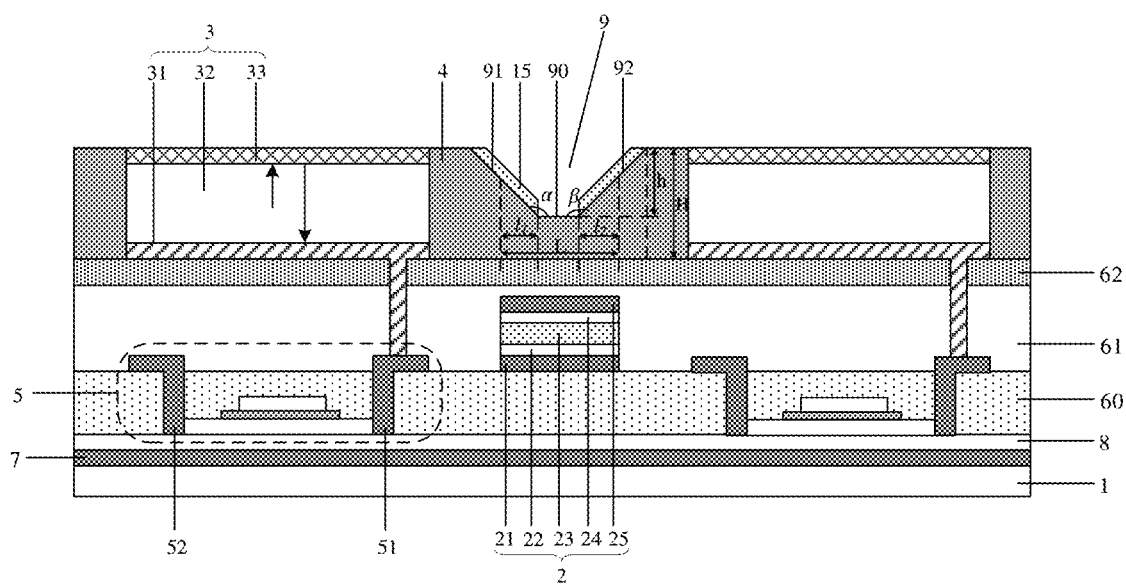

As illustrated in FIG. 7D, a reflective structure 15 is formed on at least a part of the side surface of the groove 9. For example, the reflective structure 15 is formed by a photolithography process. The structure and the material of the reflective structure 15 can be referred to the description of the previous embodiments. In other embodiments of the present disclosure, in the case where the cathode 33 is an opaque reflective electrode, for example, the reflective structure 15 is formed by one same patterning process using the metal layer for forming the cathode 33 while forming the cathode 33, that is, the reflective structure 15 and the cathode 33 are formed simultaneously using the same material, so as to simplify the manufacturing process of the display panel.

Figure 7E:
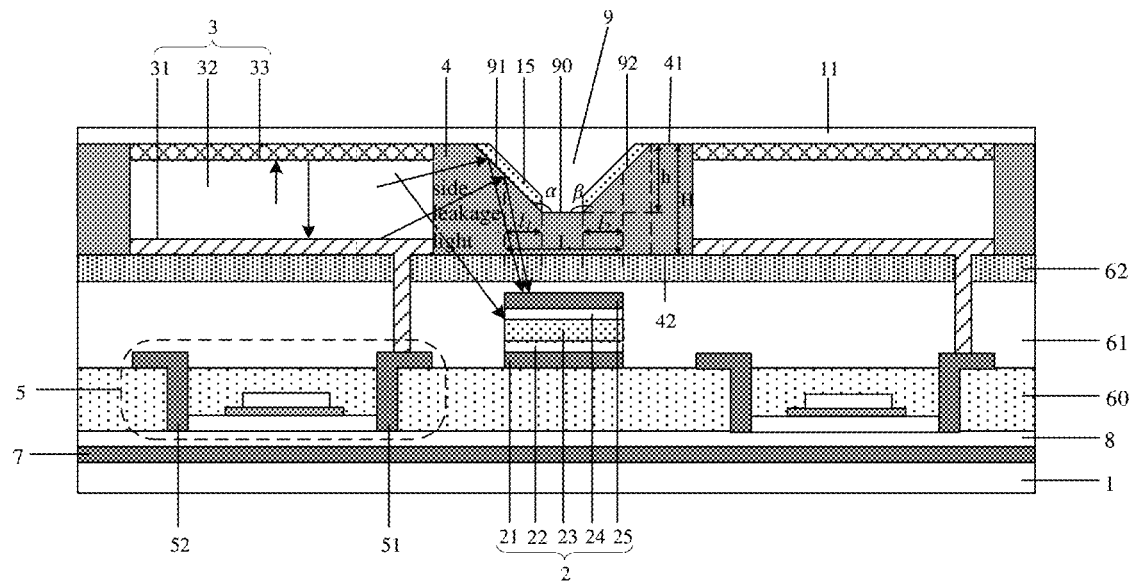

As illustrated in FIG. 7E, the light-emitting element is encapsulated by the same method as in FIG. 6L, thereby obtaining a display panel.

FIGS. 8A-8H are schematic diagram of further another manufacturing method of a display panel provided by an embodiment of the present disclosure. This method differs from the method illustrated in FIGS. 6A-6L in that the steps illustrated in FIGS. 8A-8H are executed after the steps illustrated in FIGS. 6A-6C are executed.

Figure 8A:
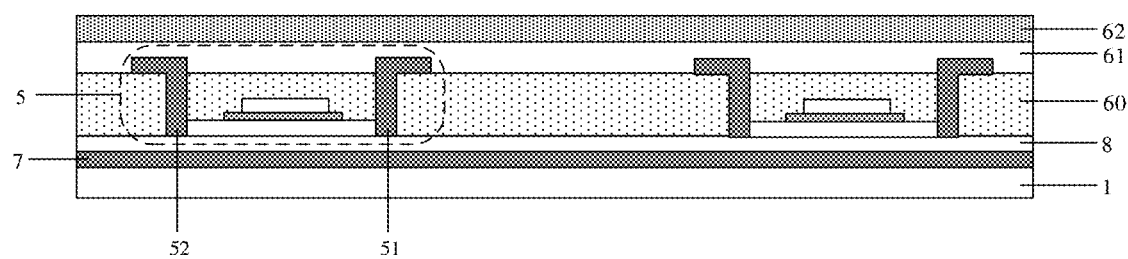
FIGS. 8A-8H are schematic diagrams of further another manufacturing method of a display panel provided by an embodiment of the present disclosure.

As illustrated in FIG. 8A, a drain electrode 51 and a source electrode 52 of the thin film transistor are formed using the first metal layer 500 illustrated in FIG. 6C by a photolithography process. In addition, a planarization layer 61 and a second insulation layer 62 that cover the drain electrode 51 and the source electrode 52 are sequentially formed. The specific methods can be referred to the previous description.

Figure 8B:
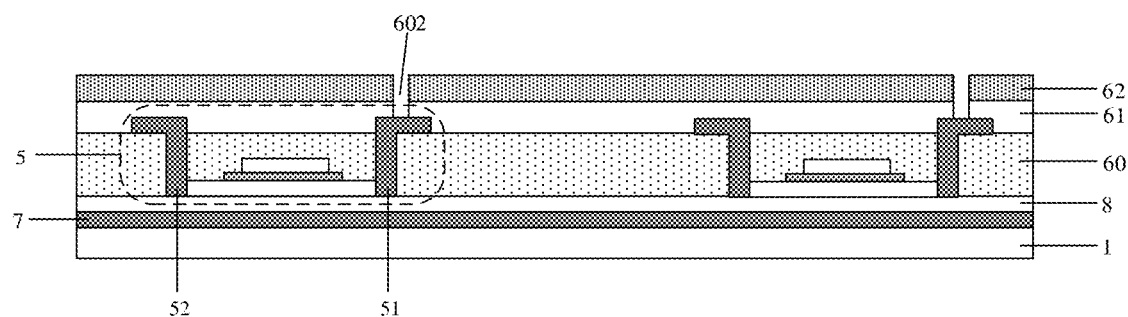

As illustrated in FIG. 8B, a second via hole 602 exposing the drain electrode 51 is formed in the planarization layer 60 and the second insulation layer 62. For example, the second via 602 can be formed by a photolithography process.

Figure 8C:
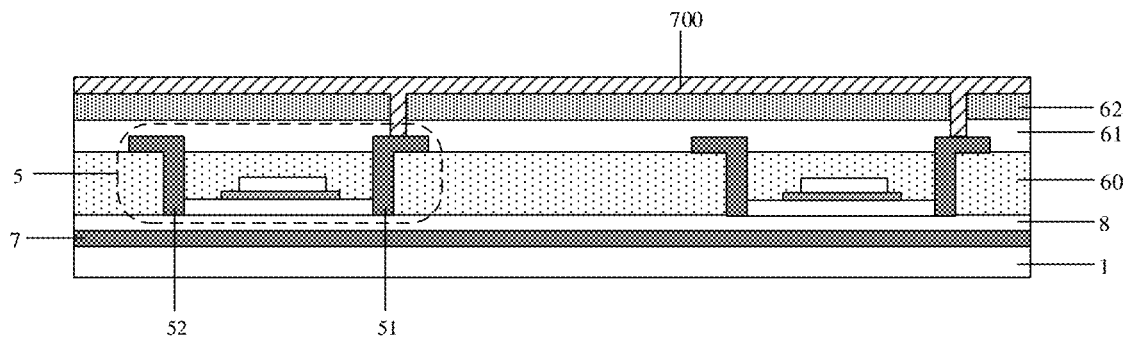

As illustrated in FIG. 8C, a second metal layer 700 is formed on the second insulation layer 62, and the second metal layer 700 is in contact with the drain electrode 51 through the second via 602. For example, the second metal layer 700 is formed by vapor deposition or chemical vapor deposition. For example, a material of the second metal layer 700 can be copper, aluminum, copper alloy or aluminum alloy, etc. Of course, the material of the second metal layer 700 is not limited to the above listed types, and the embodiments of the present disclosure are not limited thereto.

Figure 8D:
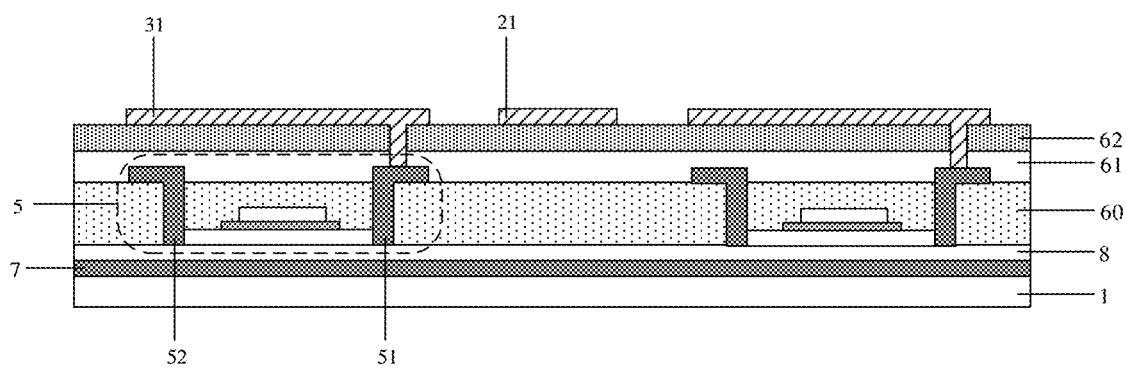

As illustrated in FIG. 8D, a first electrode 21 of a photoelectric conversion structure and an anode 31 of a light-emitting element are simultaneously formed by one same process, and the anode 31 is in contact with the drain electrode 51 through the second via hole 602, which is beneficial to simplifying the manufacturing process. For example, the first electrode 21 and the anode 31 are simultaneously formed using the second metal layer 700 by a photolithography process.

Figure 8E:
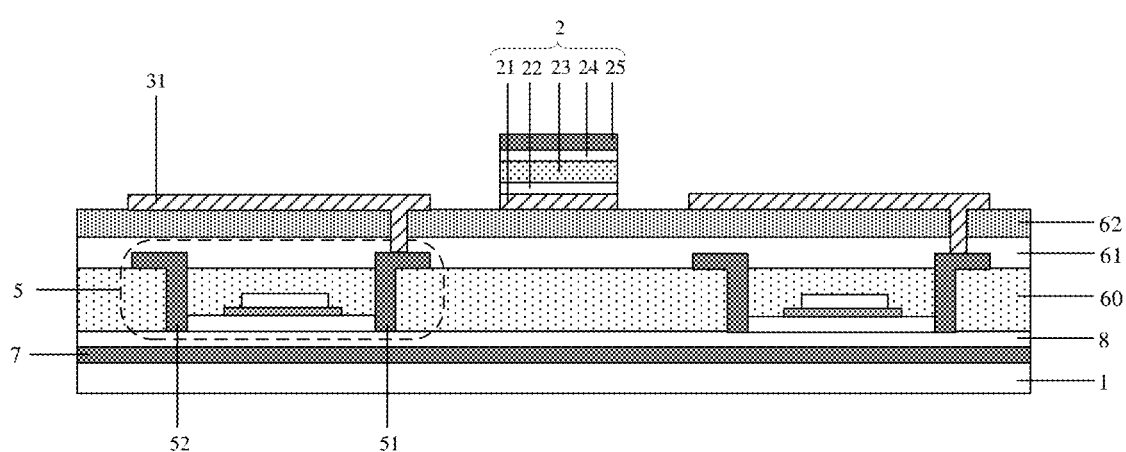

As illustrated in FIG. 8E, a second electrode 25 stacked with the first electrode 21, and a photoelectric conversion layer 20 between the first electrode 21 and the second electrode 25 are formed. The specific steps can be referred to the description of the previous embodiments and details will not be described here again.

Figure 8F:
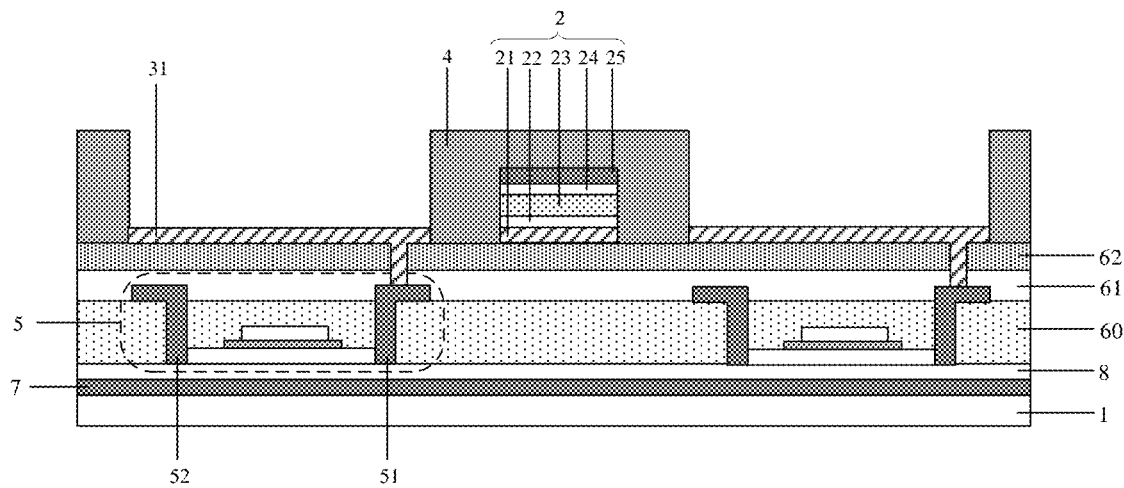

As illustrated in FIG. 8F, a pixel definition layer 4 is formed, and the photoelectric conversion structure 2 is inside the pixel definition layer 4. In this case, a distance between a surface of the photoelectric conversion structure 2 facing the base substrate 1 and the base substrate 1, a distance between a surface of the light-emitting element 3 facing the base substrate 1 and the base substrate 1, and a distance between a surface of the pixel definition layer 4 facing the base substrate 1 and the base substrate 1, are equal to each other.

Figure 8G:
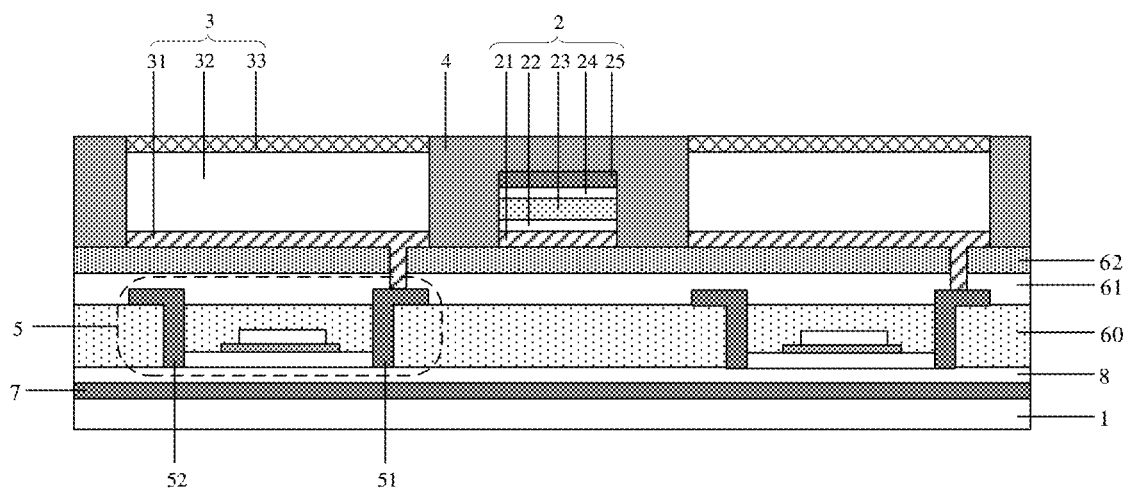

As illustrated in FIG. 8G, a light-emitting layer 32 and a cathode 33 of the light-emitting element are formed by the same method as that in FIG. 6K.

Figure 8H:
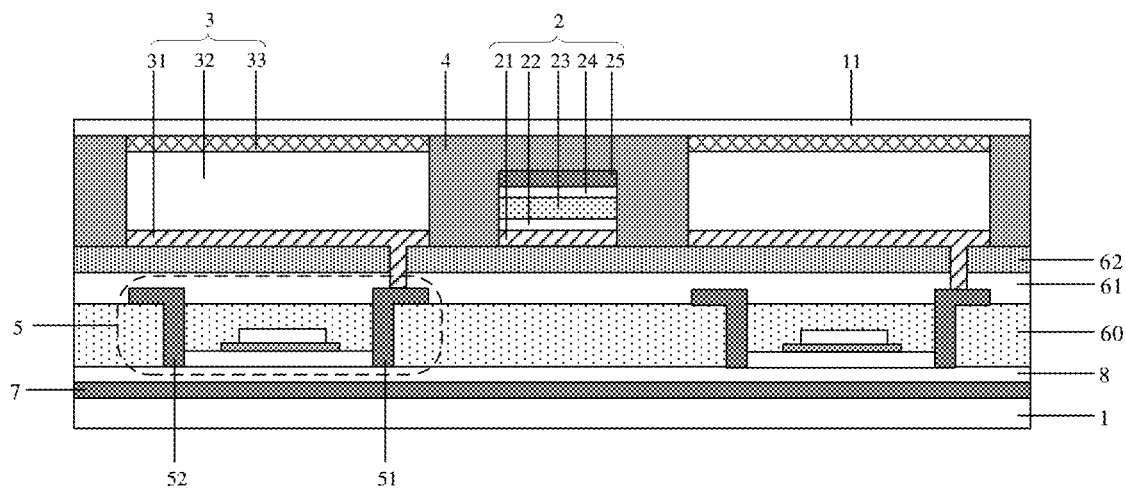

As illustrated in FIG. 8H, the light-emitting element is encapsulated by the same method as in FIG. 6L, thereby obtaining a display panel. The thickness of the display panel formed by the present method is not increase due to the arrangement of the photoelectric conversion structure.

What have been described above are only specific implementations of the present disclosure, the protection scope of the present disclosure is not limited thereto. Therefore, the protection scope of the present disclosure should be based on the protection scope of the claims.

What is claimed is:

1. A display panel, comprising:
   a base substrate;
   a light-emitting element on the base substrate; and
   a photoelectric conversion structure on the base substrate, and configured to receive a part of light emitted by the light-emitting element, convert energy of light received by the photoelectric conversion structure into electric energy, and supply the electric energy to the light-emitting element.

2. The display panel according to claim 1, wherein the photoelectric conversion structure comprises:
   a first electrode on the base substrate;
   a second electrode on a side of the first electrode away from the base substrate; and
   a photoelectric conversion layer between the first electrode and the second electrode and configured to convert energy of light received by the photoelectric conversion layer into electric energy.

3. The display panel according to claim 2, further comprising:
   a plurality of pixel units arranged in an array, wherein each pixel unit of the plurality of pixel units comprises the light-emitting element; and
   a pixel definition layer between adjacent pixel units of the plurality of pixel units to define the plurality of pixel units;
   an orthographic projection of the photoelectric conversion structure on the base substrate is within an orthographic projection of the pixel definition layer on the base substrate.

4. The display panel according to claim 3, wherein the photoelectric conversion structure is on a side of the pixel definition layer close to the base substrate and is on a side of the light-emitting element close to the base substrate.

5. The display panel according to claim 4, further comprising a driving circuit layer configured to drive the plurality of pixel units, wherein the driving circuit layer comprises a thin film transistor, and the first electrode of the photoelectric conversion structure is in a same layer as a drain electrode of the thin film transistor and a source electrode of the thin film transistor.

6. The display panel according to claim 5, wherein the light-emitting element is a top light-emitting element, and at least a part of an orthographic projection of the thin film transistor on the base substrate overlaps with an orthographic projection of the light-emitting element on the base substrate.

7. The display panel according to claim 3, wherein a distance between a lower surface of the photoelectric conversion structure facing the base substrate and the base substrate, a distance between a surface of the light-emitting element facing the base substrate and the base substrate, and a distance between a surface of the pixel definition layer facing the base substrate and the base substrate, are equal to each other.

8. The display panel according to claim 7, wherein
   the light-emitting element comprises an anode, a light-emitting layer and a cathode which are sequentially away from the base substrate; and
   the first electrode is in a same layer as the anode of the light-emitting element.

9. The display panel according to claim 7, wherein the photoelectric conversion structure is inside the pixel definition layer, and the pixel definition layer covers an upper surface of the photoelectric conversion structure facing away from the base substrate and a side surface of the photoelectric conversion structure intersected with the upper surface of the photoelectric conversion structure.

10. The display panel according to claim 3, wherein the pixel definition layer comprises a groove, the groove comprises a bottom surface parallel to the base substrate and a side surface intersected with the bottom surface;
   the orthographic projection of the photoelectric conversion structure on the base substrate is within an orthographic projection of a whole constituted by the bottom surface of the groove and the side surface of the groove on the base substrate;
   the groove is configured to allow a part of light emitted by the light-emitting element to be reflected by the side surface of the groove and then to be incident to the photoelectric conversion structure.

11. The display panel according to claim 10, wherein an included angle between the side surface and the bottom surface of the groove is an obtuse angle.

12. The display panel according to claim 11, wherein
   a range of the included angle between the side surface and the bottom surface of the groove is 110°-170°;
   an orthographic projection of the side surface of the groove on the base substrate overlaps with a part of the orthographic projection of the photoelectric conversion structure on the base substrate, and a width of the overlapped part along a direction parallel to the base substrate is ⅓ of a width of the orthographic projection of the photoelectric conversion structure on the base substrate along the direction parallel to the base substrate;
   in a direction perpendicular to the base substrate, a rest portion of the pixel definition layer other than the groove has a first surface away from the base substrate and a second surface close to the base substrate, and a distance between the bottom surface of the groove and the first surface of the pixel definition layer is larger than ⅔ of a distance between the second surface of the pixel definition layer and the first surface of the pixel definition layer.

13. The display panel according to claim 10, further comprising:
a reflective structure on at least a part of the side surface of the groove.

14. The display panel according to claim 10, wherein the side surface of the groove is a curved surface recessed toward a direction away from the bottom surface of the groove, and an included angle between a tangent line of the curved surface and the bottom surface of the groove is an obtuse angle.

15. The display panel according to claim 2, wherein the photoelectric conversion layer is a PIN junction, and the PIN junction comprises:
a P-type semiconductor layer;
an N-type semiconductor layer stacked with the P-type semiconductor layer; and
an intrinsic semiconductor layer between the N-type semiconductor layer and the P-type semiconductor layer.

16. The display panel according to claim 15, wherein a material of the P-type semiconductor layer, a material of the N-type semiconductor layer, and a material of the intrinsic semiconductor layer are all amorphous silicon.

17. The display panel according to claim 2, wherein the first electrode is an opaque reflective electrode, and the second electrode is a transparent electrode or an opaque reflective electrode.

18. The display panel according to claim 2, further comprising a power supply, wherein
the light-emitting element comprises an anode, a light-emitting layer and a cathode which are sequentially away from the base substrate;
the first electrode of the photoelectric conversion structure and the second electrode of the photoelectric conversion structure are electrically connected with an input terminal of the power supply;
the anode of the light-emitting element and the cathode of the light-emitting element are electrically connected with an output terminal of the power supply.

19. A display device, comprising the display panel according to claim 1.

20. A manufacturing method of a display panel, comprising:
providing a base substrate;
forming a light-emitting element and a photoelectric conversion structure on the base substrate;
wherein the photoelectric conversion structure is configured to receive a part of light emitted by the light-emitting element, convert energy of light received by the photoelectric conversion structure into electric energy, and supply the electric energy to the light-emitting element.

* * * * *